(12) United States Patent
Akita et al.

(10) Patent No.: US 7,794,913 B2
(45) Date of Patent: Sep. 14, 2010

(54) CHEMICALLY AMPLIFIED POSITIVE RESIST COMPOSITION

(75) Inventors: Makoto Akita, Hsin-Chu (TW); Masumi Suetsugu, Toyonaka (JP); Kazuhiko Hashimoto, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 310 days.

(21) Appl. No.: 12/121,458

(22) Filed: May 15, 2008

(65) Prior Publication Data
US 2008/0286691 A1 Nov. 20, 2008

(30) Foreign Application Priority Data
May 18, 2007 (JP) ............................. 2007-132614

(51) Int. Cl.
*G03F 7/004* (2006.01)
(52) U.S. Cl. .................... 430/170; 430/270.1; 430/905; 430/910
(58) Field of Classification Search ................. 430/170, 430/270.1, 905, 910
See application file for complete search history.

(56) References Cited

U.S. PATENT DOCUMENTS

| | | | |
|---|---|---|---|
| 6,656,660 B1 * | 12/2003 | Urano et al. ............. 430/270.1 |
| 6,696,218 B2 | 2/2004 | Ichimura et al. |
| 2003/0013038 A1 | 1/2003 | Ichimura et al. |
| 2005/0042540 A1 | 2/2005 | Okubo et al. |
| 2009/0004601 A1 * | 1/2009 | Akita et al. ............. 430/286.1 |

FOREIGN PATENT DOCUMENTS

JP 2006-330401 A 12/2006

* cited by examiner

*Primary Examiner*—John S Chu
(74) *Attorney, Agent, or Firm*—Birch, Stewart, Kolasch & Birch, LLP

(57) ABSTRACT

A chemically amplified positive resist composition comprising (A) a resin which comprises (i) a polymerization unit represented by the formula (I):

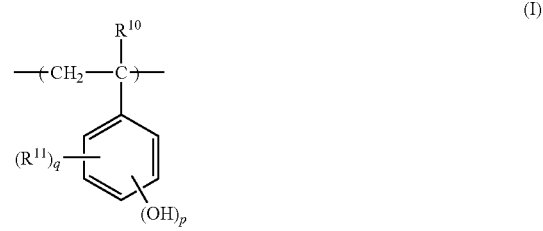

(ii) a polymerization unit represented by the formula (II):

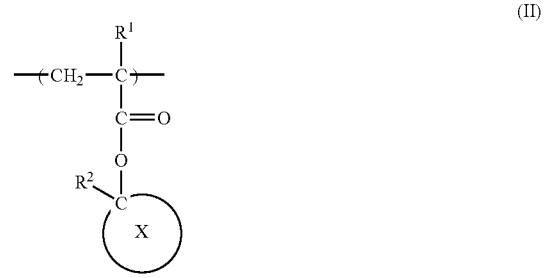

and (iii) at least one polymerization unit selected from the group consisting of a polymerization unit represented by the formula (III):

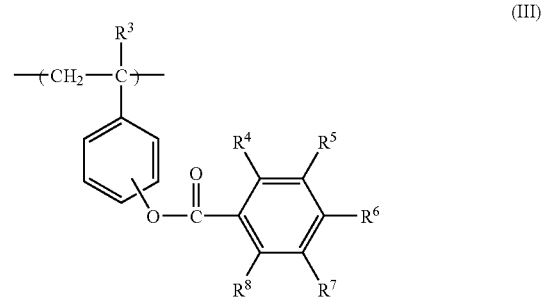

and a polymerization unit represented by the formula (IV):

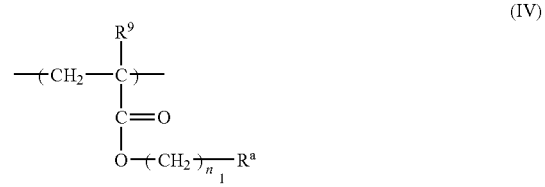

and (B) at least one acid generator.

16 Claims, No Drawings

CHEMICALLY AMPLIFIED POSITIVE RESIST COMPOSITION

This nonprovisional application claims priority under 35 U.S.C. §119(a) on Patent Application No. 2007-132614 filed in JAPAN on May 18, 2007, the entire contents of which are hereby incorporated by reference.

FIELD OF THE INVENTION

The present invention relates to a chemically amplified positive resist composition.

BACKGROUND OF THE INVENTION

A chemically amplified positive resist composition is used for semiconductor microfabrication employing a lithography process using i-rays, KrF, ArF and electron beam; forming a bump or a thick film resist pattern in the production of semiconductor devices; forming a wiring pattern or a thick film resist laminated body in the production of circuit board; and the like.

It is expected for the chemically amplified resist composition to give patterns having high resolution and good pattern profile.

US 2005/0042540 A1 discloses a chemically amplified positive resist composition comprising a resin which comprises a polymerization unit derived from hydroxystyrene and a polymerization unit derived from a (meth)acrylate ester, and an acid generator.

SUMMARY OF THE INVENTION

The present invention relates to the followings:

<1> A chemically amplified positive resist composition comprising (A) a resin which comprises (i) a polymerization unit represented by the formula (I):

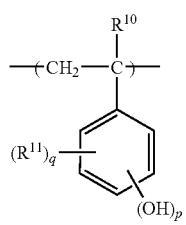

(I)

wherein $R^{10}$ represents a hydrogen atom or a C1-C4 alkyl group, $R^{11}$ represents a C1-C4 alkyl group, p represents an integer of 1 to 3, and q represents an integer of 0 to 2, and when q is 1 or 2, $R^{11}$s may be the same or different, (ii) a polymerization unit represented by the formula (II):

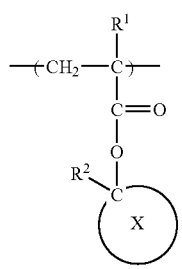

(II)

wherein $R^1$ represents a hydrogen atom or a methyl group, $R^2$ represents a C1-C8 alkyl group and ring X represents an alicyclic hydrocarbon group, and (iii) at least one polymerization unit selected from the group consisting of a polymerization unit represented by the formula (III):

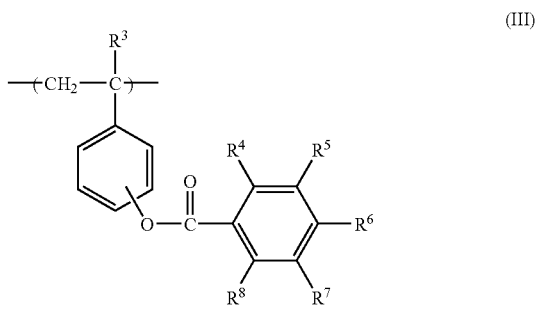

(III)

wherein $R^3$ represents a hydrogen atom or a C1-C4 alkyl group, and $R^4$, $R^5$, $R^6$, $R^7$ and $R^8$ each independently represents a hydrogen atom, a C1-C4 alkyl group, a C1-C4 alkoxy group or a hydroxyl group and a polymerization unit represented by the formula (IV):

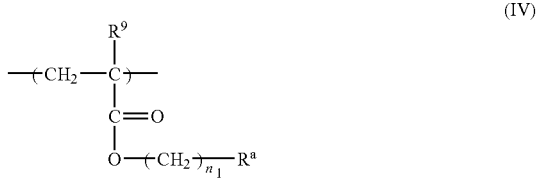

(IV)

wherein $R^9$ represents a hydrogen atom or a methyl group, $n_1$ represents 0 or 1, and $R^a$ represents an anthryl group which may be substituted with at least one selected from the group consisting of a C1-C6 alkyl group and a hydroxyl group, and (B) at least one acid generator;

<2> The chemically amplified positive resist composition according to <1>, wherein at least one polymerization unit selected from the group consisting of a polymerization unit represented by the formula (III) and a polymerization unit represented by the formula (IV) is a polymerization unit represented by the formula (III);

<3> The chemically amplified positive resist composition according to <1> or <2>, wherein the polymerization unit represented by the formula (II) is a polymerization unit represented by the formula (IIa):

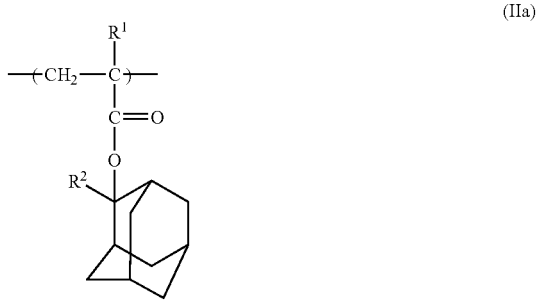

(IIa)

wherein $R^1$ represents a hydrogen atom or a methyl group and $R^2$ represents a C1-C8 alkyl group;

<4> The chemically amplified positive resist composition according to <1>, <2> or <3>, wherein p is 1 and q is 0 in the formula (I);

<5> The chemically amplified positive resist composition according to any one of <1> to <4>, wherein at least one acid generator comprises diazomethane compound having a sulfonyl group;

<6> The chemically amplified positive resist composition according to any one of <1> to <5>, wherein the polymerization unit represented by the formula (I), the polymerization unit represented by the formula (II) and at least one polymerization unit selected from the group consisting of the polymerization unit represented by the formula (III) and the polymerization unit represented by the formula (IV) are in the range of 30 to 89.9% by mole, in the range of 10 to 40% by mole and is in the range of 0.1 to 30% by mole respectively based on all polymerization units of the resin;

<7> The chemically amplified positive resist composition according to any one of <1> to <6>, wherein the chemically amplified positive resist composition further comprises a basic compound;

<8> A chemically amplified positive resist composition comprising (A1) a resin which comprises a polymerization unit represented by the formula (I):

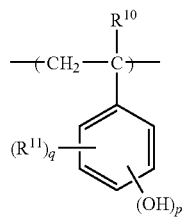

(I)

wherein $R^{10}$ represents a hydrogen atom or a C1-C4 alkyl group, $R^{11}$ represents a C1-C4 alkyl group, p represents an integer of 1 to 3, and q represents an integer of 0 to 2, and when q is 1 or 2, R11s may be the same or different, and a polymerization unit represented by the formula (II):

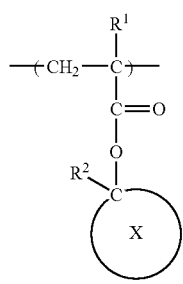

(II)

wherein $R^1$ represents a hydrogen atom or a methyl group, $R^2$ represents a C1-C8 alkyl group and ring X represents an alicyclic hydrocarbon group, (A2) a resin which comprises a polymerization unit represented by the formula (I) and at least one polymerization unit selected from the group consisting of a polymerization unit represented by the formula (III):

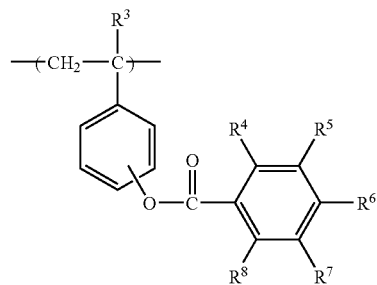

(III)

wherein $R^3$ represents a hydrogen atom or a C1-C4 alkyl group, and $R^4$, $R^5$, $R^6$, $R^7$ and $R^8$ each independently represents a hydrogen atom, a C1-C4 alkyl group, a C1-C4 alkoxy group or a hydroxyl group and a polymerization unit represented by the formula (IV):

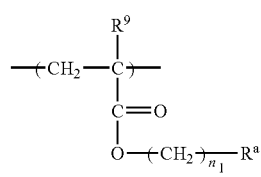

(IV)

wherein $R^9$ represents a hydrogen atom or a methyl group, $n_1$ represents 0 or 1, and $R^a$ represents an anthryl group which may be substituted with at least one selected from the group consisting of a C1-C6 alkyl group and a hydroxyl group, and (B') at least one acid generator;

<9> The chemically amplified positive resist composition according to <8>, wherein at least one polymerization unit selected from the group consisting of a polymerization unit represented by the formula (III) and a polymerization unit represented by the formula (IV) is a polymerization unit represented by the formula (III);

<10> The chemically amplified positive resist composition according to <8> or <9>, wherein the polymerization unit represented by the formula (II) is a polymerization unit represented by the formula (IIa):

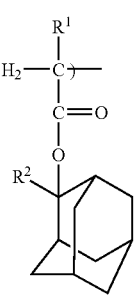

(IIa)

wherein $R^1$ represents a hydrogen atom or a methyl group and $R^2$ represents a C1-C8 alkyl group;

<11> The chemically amplified positive resist composition according to <8>, <9> or <10>, wherein p is 1 and q is 0 in the formula (I);

<12> The chemically amplified positive resist composition according to any one of <8> to <11>, wherein at least one acid generator comprises diazomethane compound having a sulfonyl group;

<13> The chemically amplified positive resist composition according to any one of <8> to <12>, wherein the amount ratio of the resin (A1) and the resin (A2) is 40/60 to 90/10;

<14> The chemically amplified positive resist composition according to any one of <8> to <13>, wherein the polymerization unit represented by the formula (I) and the polymerization unit represented by the formula (II) are in the range of 40 to 85% by mole and in the range of 15 to 60% by mole respectively based on all polymerization units of the resin (A1);

<15> The chemically amplified positive resist composition according to any one of <8> to <14>, wherein the polymerization unit represented by the formula (I) and at least one polymerization unit selected from the group consisting of a polymerization unit represented by the formula (III) and a polymerization unit represented by the formula (IV) are in the range of 50 to 90% by mole and in the range of 10 to 50% by mole respectively based on all polymerization units of the resin (A2);

<16> The chemically amplified positive resist composition according to any one of <8> to <15>, wherein the chemically amplified positive resist composition further comprises a basic compound.

DESCRIPTION OF PREFERRED EMBODIMENTS

The present chemically amplified positive resist composition (hereinafter, simply referred to as COMPOSITION 1) comprises (A) a resin which comprises (i) a polymerization unit represented by the formula (I), (ii) a polymerization unit represented by the formula (II), and (iii) at least one polymerization unit selected from the group consisting of a polymerization unit represented by the formula (III) and a polymerization unit represented by the formula (IV), and (B) at least one acid generator.

Hereinafter, the component (A) is simply referred to as the resin (A) and the component (B) is simply referred to as the acid generator (B).

In the formula (I), $R^{10}$ represents a hydrogen atom or a C1-C4 alkyl group, and $R^{11}$ represents a C1-C4 alkyl group.

Examples of the C1-C4 alkyl group include a methyl, ethyl, n-propyl, isopropyl, n-butyl and tert-butyl group. As $R^{10}$, a hydrogen atom or a methyl group is preferable and a hydrogen atom is more preferable.

In the formula (I), p represents an integer of 1 to 3, and p is preferably 1. In the formula (I), q represents an integer of 0 to 2, and q is preferably 0 or 1 and q is more preferably 0. When q is 1 or 2, $R^{11}$s may be the same or different.

The polymerization unit represented by the formula (I) is usually derived from a monomer represented by the formula (I-1):

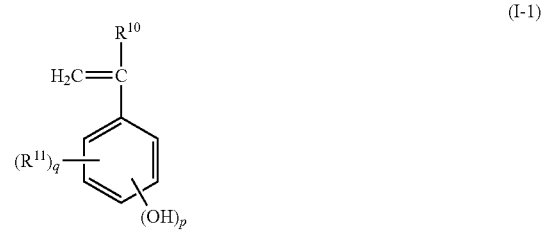

wherein $R^{10}$, $R^{11}$, p and q are the same as defined above.

Preferable examples of the monomer represented by the formula (I-1) include a hydroxystyrene and more preferable examples thereof include p-hydroxystyrene.

In the formula (II), $R^1$ represents a hydrogen atom or a methyl group, $R^2$ represents a C1-C8 alkyl group and ring X represents an alicyclic hydrocarbon group.

Examples of the C1-C8 alkyl group include a methyl, ethyl, n-propyl, isopropyl, n-butyl, tert-butyl, n-pentyl, n-hexyl, cyclohexyl, n-octyl group, and a C1-C4 alkyl group is preferable, and ethyl and isopropyl group are preferable.

The alicyclic hydrocarbon group may be a monocyclic aliphatic hydrocarbon group or a polycyclic aliphatic hydrocarbon group. Preferable examples thereof include a cyclopentyl, cyclohexyl, adamantly and norbornyl group, and adamantly group is more preferable.

Preferable examples of the polymerization unit represented by the formula (II) include the following polymerization unit represented by the formula (IIa):

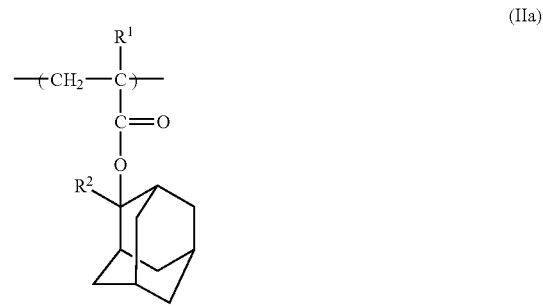

wherein $R^1$ represents a hydrogen atom or a methyl group and $R^2$ represents a C1-C8 alkyl group.

The polymerization unit represented by the formula (II) is usually derived from a monomer represented by the formula (II-1):

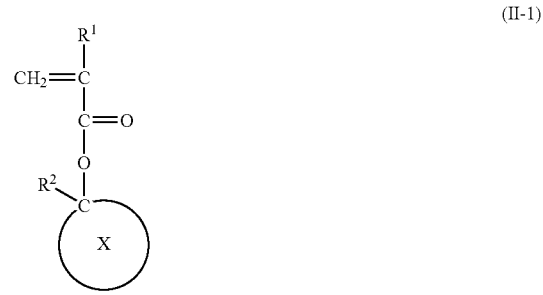

wherein $R^1$, $R^2$ and ring X are the same as defined above.

The polymerization unit represented by the formula (IIa) is usually derived from a monomer represented by the formula (IIa-1):

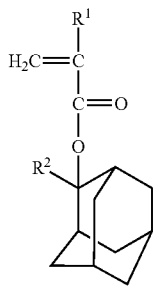
(IIa-1)

wherein $R^1$ and $R^2$ are the same as defined above.

Preferable examples of the monomer represented by the formula (IIa-1) include 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate, 2-isopropyl-2-adamantyl methacrylate, 2-n-butyl-2-adamantyl acrylate, and 2-n-butyl-2-adamantyl methacrylate, and 2-ethyl-2-adamantyl acrylate and 2-ethyl-2-adamantyl methacrylate are more preferable.

In the formula (III), $R^3$ represents a hydrogen atom or a C1-C4 alkyl group, and $R^4$, $R^5$, $R^6$, $R^7$ and $R^8$ each independently represents a hydrogen atom, a C1-C4 alkyl group, a C1-C4 alkoxy group or a hydroxyl group.

Examples of the C1-C4 alkyl group include a methyl, ethyl, n-propyl, isopropyl, n-butyl, isobutyl and tert-butyl group. Examples of the C1-C4 alkoxy group include a methoxy, ethoxy, n-propoxy, isopropoxy, n-butoxy, isobutoxy and tert-butoxy group. As $R^3$, a hydrogen atom or a methyl group is preferable. $R^4$, $R^5$, $R^6$, $R^7$ and $R^8$ are preferably hydrogen atoms.

As the polymerization unit represented by the formula (III), a polymerization unit represented by the formula (IIIa):

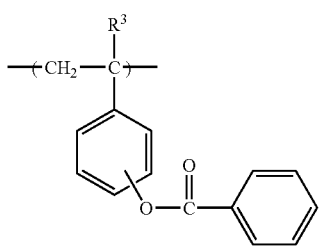
(IIIa)

wherein $R^3$ is the same as defined above, is preferable, and a polymerization unit represented by the formula (IIIb):

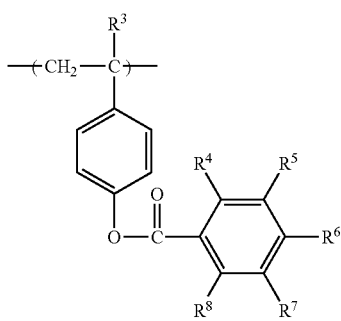
(IIIb)

wherein $R^3$ is the same as defined above, is more preferable.

In the formula (IV), $R^9$ represents a hydrogen atom or a methyl group, $n_1$ represents 0 or 1, and $R^a$ represents an anthryl group which may be substituted with at least one selected from the group consisting of a C1-C6 alkyl group and a hydroxyl group.

Examples of the C1-C6 alkyl group include a methyl, ethyl, n-propyl, isopropyl, n-butyl, isobutyl, tert-butyl, n-pentyl and n-hexyl group.

The anthryl group may be 1-anthryl group, 2-anthryl group or 9-anthryl group, and 9-anthryl group is preferable. As $R^a$, unsubstituted anthryl group is preferable.

As the polymerization unit represented by the formula (IV), a polymerization unit represented by the formula (IVb):

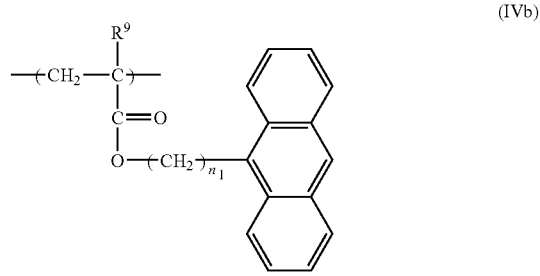
(IVb)

wherein $R^9$ and $n_1$ are the same as defined above, is preferable.

As at least one polymerization unit selected from the group consisting of a polymerization unit represented by the formula (III) and a polymerization unit represented by the formula (IV), the polymerization unit represented by the formula (III) is preferable.

The polymerization unit represented by the formula (III) is usually derived from a monomer represented by the formula (III-1):

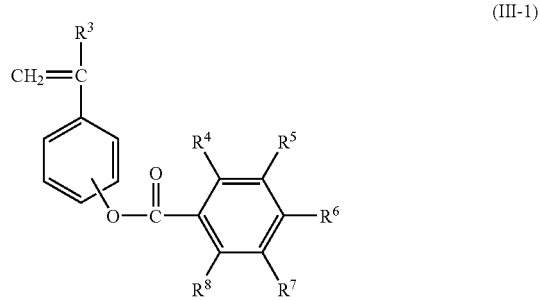
(III-1)

wherein $R^3$, $R^4$, $R^5$, $R^6$, $R^7$ and $R^8$ are the same as defined above, and the polymerization unit represented by the formula (IV) is usually derived from a monomer represented by the formula (IV-1):

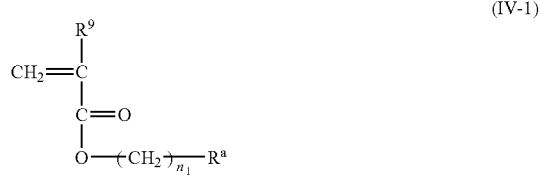
(IV-1)

wherein $R^9$, $n_1$ and $R^a$ are the same as defined above.

The polymerization unit represented by the formula (I) is usually in the range of 30 to 89.9% by mole based on all polymerization units of the resin (A). The polymerization unit represented by the formula (II) is usually in the range of 10 to 40% by mole based on all polymerization units of the resin (A). At least one polymerization unit selected from the group consisting of the polymerization unit represented by the formula (III) and the polymerization unit represented by the formula (IV) is usually in the range of 0.1 to 30% by mole based on all polymerization units of the resin (A).

The resin comprising the polymerization unit represented by the formula (I), the polymerization unit represented by the formula (II) and the polymerization unit represented by the formula (III) can be produced by polymerizing a monomer represented by the formula (I-2):

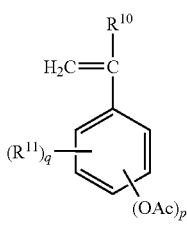

(I-2)

wherein $R^{10}$, $R^{11}$, p and q are the same as defined above, and Ac represents an acetyl group, the monomer represented by the formula (II-1) and the monomer represented by the formula (III-1) followed by hydrolyzing of the resin obtained.

When p is 1 and q is 0 in the formula (I), the resin which comprises the polymerization unit represented by the formula (I), the polymerization unit represented by the formula (II), and the polymerization unit represented by the formula (III) can also be produced by polymerizing a monomer represented by the formula:

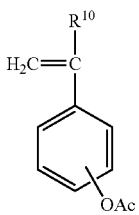

wherein $R^{10}$ and Ac are the same as defined above, the monomer represented by the formula (II-1) and the monomer represented by the formula (III-1), hydrolyzing of the resin obtained and reacting the resin hydrolyzed with a compound represented by the formula (IIIb):

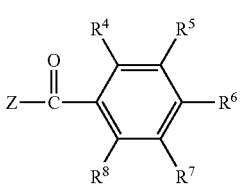

(IIIb)

Wherein $R^4$, $R^5$, $R^6$, $R^7$ and $R^8$ are the same as defined above, and Z represents a halogen atom, in the presence of a base.

Examples of the base include an organic base such as triethylamine.

The resin comprising the polymerization unit represented by the formula (I), the polymerization unit represented by the formula (II) and the polymerization unit represented by the formula (IV) can be produced by polymerizing the monomer represented by the formula (I-2), the monomer represented by the formula (II-1) and the monomer represented by the formula (IV-1) followed by hydrolyzing of the resin produced.

The resin comprising the polymerization unit represented by the formula (I), the polymerization unit represented by the formula (II), the polymerization unit represented by the formula (III) and the polymerization unit represented by the formula (IV) can be produced by polymerizing a monomer represented by the formula (I-2), the monomer represented by the formula (II-1), the monomer represented by the formula (III-1) and the monomer represented by the formula (IV-1) followed by hydrolyzing of the resin obtained.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); a hydroperoxide such as tert-butyl hydroperoxide and benzoyl peroxide; an oxidation-reduction initiator such as hydrogen peroxide/ferrous salt and benzoyl peroxide/dimethylaniline; and an alkyl metal compound such as butyl lithium and triethylaluminum. Among them, the azo compound is preferable and 2,2'-azobisisobutyronitrile, 2,2'-azobis(2-methylbutyronitrile), 1,1'-azobis (cyclohexane-1-carbonitrile), 2,2'-azobis(2,4-dimethylvaleronitrile) and dimethyl-2,2'-azobis(2-methylpropionate) are more preferable.

These radical initiators may be used alone or in a form of a mixture of two or more kinds thereof. When the mixture of two or more kinds thereof is used, the mixed ratio is not particularly limited.

The amount of the radical initiator is preferably 1 to 20% by mole based on molar amount of all monomers.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran, a ketone solvent such as methyl isobutyl ketone; an alcohol solvent such as methyl alcohol, ethyl alcohol, isopropyl alcohol tert-butyl alcohol; a cyclic ester solvent such as γ-butyrolactone; a glycol ether ester solvent such as propylene glycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers.

After competition of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

Next, the acid generator (B) will be illustrated.

COMPOSITION 1 may contain an acid generator or two or more acid generators. COMPOSITION 1 preferable contains two or more acid generators.

The acid generator generates an acid by irradiation to itself or the composition containing the same, and the acid generated catalytically acts against the resin (A), and the resin (A) becomes soluble in an aqueous alkali solution.

The acid generator can be selected from various compounds generating the acid by irradiation with radiation on the acid generator itself or COMPOSITION 1.

As the acid generator, at least one selected from an onium salt, a halogenated alkyltriazine compound, a diazomethane compound having a sulfonyl group, a sulfonate compound and an imide compound having a sulfonyloxy group, is preferable. The onium salt, the diazomethane compound having a sulfonyl group and a mixture thereof are more preferable and a mixture of the onium salt and the diazomethane compound having a sulfonyl group is more preferable.

Examples of the onium salt include the salts represented by the formula (VIII):

$$A^+ {}^-O_3S-R^{23} \quad (VIII)$$

wherein $R^{23}$ represents a linear or branched chain perfluoroalkyl group, or an aryl group which may be substituted, and $A^+$ represents an organic counter cation.

Examples of the linear or branched chain perfluoroalkyl group include a trifluoromethyl pentafluoroethyl, heptafluoropropyl, nonafluorobutyl and perfluorooctyl group. The linear or branched chain C1-C8 perfluoroalkyl group is preferable.

Examples of the aryl group include a C6-C20 aryl group such as a phenyl, naphthyl and anthryl group. Examples of the substituent of the aryl group include a C1-C20 alkyl group, a C1-C20 alkoxy group and a halogen atom.

Examples of the C1-C20 alkyl group include a methyl, ethyl, n-propyl, isopropyl, n-butyl, tert-butyl, n-pentyl, n-hexyl, n-octyl, n-decyl, n-dodecyl and n-hexadecyl group.

Examples of the C1-C20 alkoxy group include a methoxy, ethoxy, n-propoxy, isopropoxy, n-butoxy, tert-butoxy, n-pentyloxy, n-hexyloxy, isopentyloxy, n-decyloxy, n-dodecyloxy and n-hexadecyloxy group.

Examples of the halogen atom include a fluorine, chlorine, bromine and iodine atom.

As $R^{23}$, the linear or branched chain C1-C8 perfluoroalkyl group and the phenyl group which may be substituted with at least one group selected from a C1-C20 alkyl group and a halogen atom are preferable.

Examples of the anion part of the salt represented by the formula (VIII) include the followings:

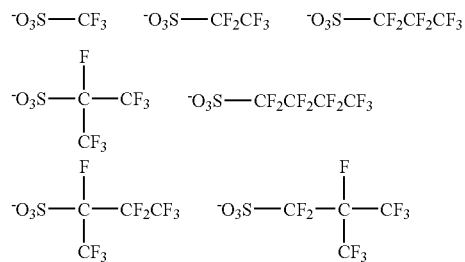

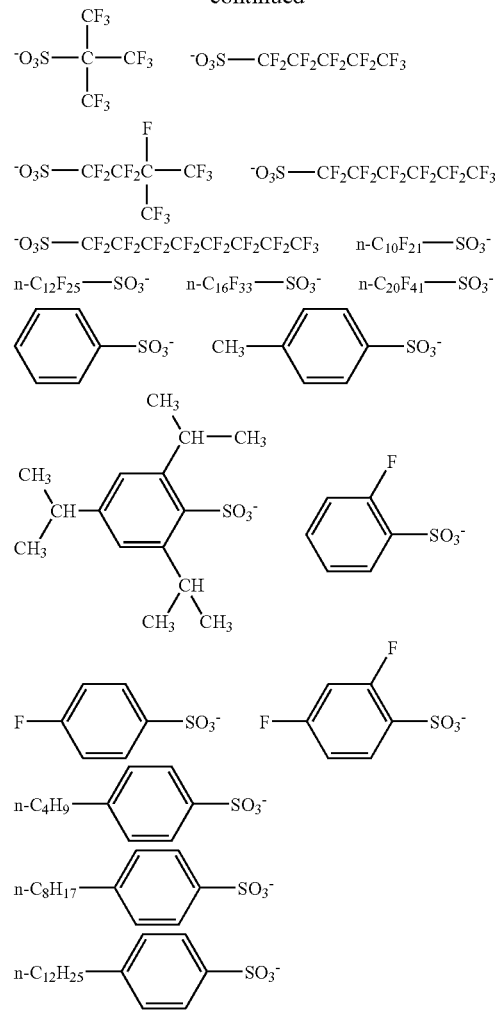

Examples of the organic counter cation include the following cations represented by the formulae (VIIIa), (VIIIb), (VIIIc) and (VIIId):

(VIIIa)

wherein $P^1$, $P^2$ and $P^3$ each independently represent a C1-C30 alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group, a cation represented by the formula (VIIIb):

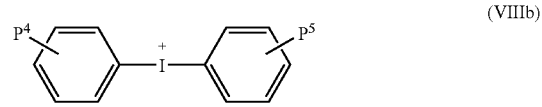
(VIIIb)

wherein $P^4$ and $P^5$ each independently represent a hydrogen atom, a hydroxyl group, a C1-C12 alkyl group or a C1-C12 alkoxy group, a cation represented by the formula (VIIIc):

(VIIIc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, and at least one —CH$_2$— in the divalent acyclic hydrocarbon group may be substituted with —CO—, —O— or —S—, $P^8$ represents a hydrogen atom, $P^9$ represents a C1-C12 alkyl group, a C3-C12 cycloalkyl group or an aromatic group which may be substituted, or $P^8$ and $P^9$ bond to form a divalent acyclic hydrocarbon group which forms a 2-oxocycloalkyl group together with the adjacent —CHCO—, and at least one —CH$_2$— in the divalent acyclic hydrocarbon group may be substituted with —CO—, —O— or —S—, and a cation represented by the formula (VIIId):

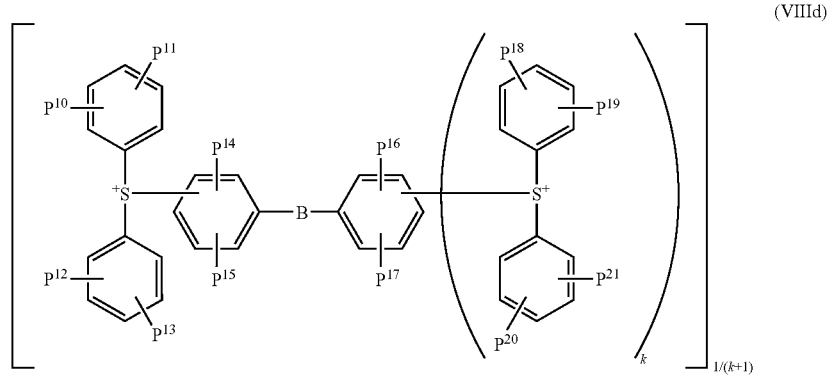

(VIIId)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ independently represent a hydrogen atom, a hydroxyl group, a C1-C12 alkyl group or a C1-C12 alkoxy group, B represents a sulfur or oxygen atom and k represents 0 or 1.

Examples of the C1-C12 alkoxy group in the formula (VIIIa) include a methoxy, ethoxy, n-propoxy, isopropoxy, n-butoxy, isobutoxy, sec-butoxy, tert-butoxy, n-pentyloxy, n-hexyloxy, n-octyloxy and 2-ethylhexyloxy group. Examples of the C3-C12 cyclic hydrocarbon group in the formula (VIIIa) include a cyclopentyl, cyclohexyl, 1-adamantyl, 2-adamantyl, phenyl, 2-methylphenyl, 4-methylphenyl, 1-naphthyl and 2-naphthyl group.

Examples of the C1-C30 alkyl group which may be substituted with at least one selected from the hydroxyl group, the C3-C12 cyclic hydrocarbon group and the C1-C12 alkoxy group in the formula (VIIIa) include a methyl, ethyl, n-propyl, isopropyl, n-butyl, isobutyl, sec-butyl, tert-butyl, n-pentyl, n-hexyl, n-octyl, 2-ethylhexyl and benzyl group.

Examples of the C3-C30 cyclic hydrocarbon group which may be substituted with at least one selected from the hydroxyl group and the C1-C12 alkoxy group in the formula (VIIIa) include a cyclopentyl, cyclohexyl, 1-adamantyl, 2-adamantyl, bicyclohexyl, phenyl, 2-methylphenyl, 4-methylphenyl, 4-ethylphenyl, 4-isopropylphenyl, 4-tert-butylphenyl, 2,4-dimethylphenyl, 2,4,6-trimethylphenyl, 4-n-hexylphenyl, 4-n-octylphenyl, 1-naphthyl, 2-naphthyl, fluorenyl, 4-phenylphenyl, 4-hydroxyphenyl, 4-methoxyphenyl, 4-tert-butoxyphenyl, 4-n-hexyloxyphenyl group.

Examples of the C1-C12 alkyl group in the formulae (VIIIb), (VIIIc) and (VIIId) include a methyl, ethyl, n-propyl, isopropyl, n-butyl, isobutyl, sec-butyl, tert-butyl, n-pentyl, n-hexyl, n-octyl and 2-ethylhexyl group. Examples of the C1-C12 alkoxy group in the formulae (VIIIb) and (VIIId) include the same groups as mentioned in the above formula (IIa).

Examples of the C3-C12 cycloalkyl group in the formula (VIIIc) include a cyclopropyl, cyclobutyl, cyclopentyl, cyclohexyl, cycloheptyl, cyclooctyl and cyclodecyl group. Examples of the C3-C12 divalent acyclic hydrocarbon group formed by bonding $P^6$ and $P^7$ include a trimethylene, tetramethylene, pentamethylene group. Examples of the ring group formed together with the adjacent $S^+$ and the divalent acyclic hydrocarbon group include a tetramethylenesulfonio, pentamethylenesulfonio and oxybisethylenesulfonio group.

Examples of the aromatic group in the formula (VIIIc) include a phenyl, tolyl, xylyl and naphthyl group. Examples of the divalent acyclic hydrocarbon group formed by bonding $P^8$ and $P^9$ include a methylene, ethylene, trimethylene, tetramethylene and pentamethylene group and examples of the 2-oxocycloalkyl group formed together with the adjacent —CHCO— and the divalent acyclic hydrocarbon group include a 2-oxocyclopentyl and 2-oxocyclohexyl group.

The cation represented by the formula (VIIIa) or (VIIIc) is preferable and the cation represented by the formula (VIIIa) is more preferable.

As the counter cation represented by $A^+$, cations represented by the following formulae (VIIIe), (VIIIf) and (VIIIg):

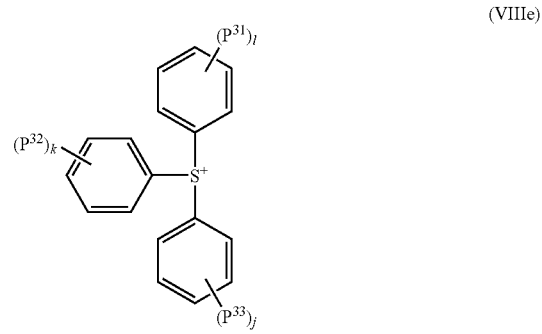

(VIIIe)

-continued

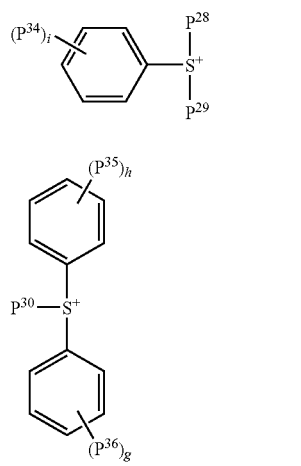

(VIIIf)

(VIIIg)

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^{31}$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and l, k, j, i, h and g each independently represent an integer of 0 to 5, are also preferable.

Examples of the C1-C20 alkyl group include a methyl, ethyl, n-propyl, isopropyl, n-butyl, tert-butyl, n-hexyl, n-octyl, n-decyl and n-icosyl group.

Examples of the C1-C12 alkoxy group and the C3-C30 cyclic hydrocarbon group include the same groups as mentioned above.

As the counter cation represented by $A^+$, a cation represented by the formula (VIIIh):

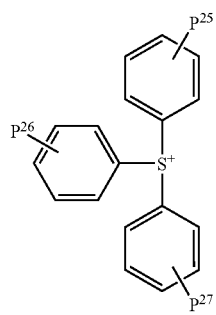

(VIIIh)

wherein $P^{25}$, $P^{26}$ and $P^{27}$ each independently represent a hydrogen atom, a hydroxyl group, a C1-C12 alkyl group or a C1-C12 alkoxy group, is more preferable, and a cation represented by the formula (VIIIi):

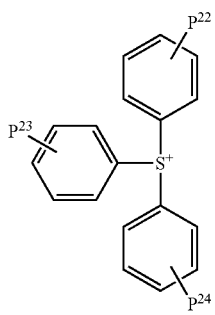

(VIIIi)

wherein $P^{22}$, $P^{23}$ and $P^{24}$ each independently represent a hydrogen atom or a C1-C4 alkyl group, is especially preferable.

Examples of the alkyl group and the alkoxy group include the same groups as mentioned above.

Examples of the cation represented by the formula (VIIIa) include the followings.

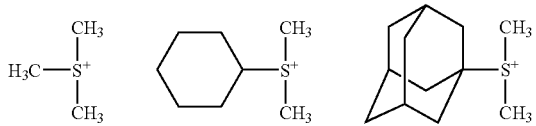

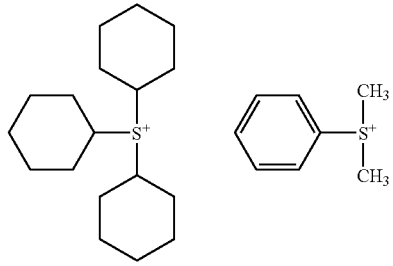

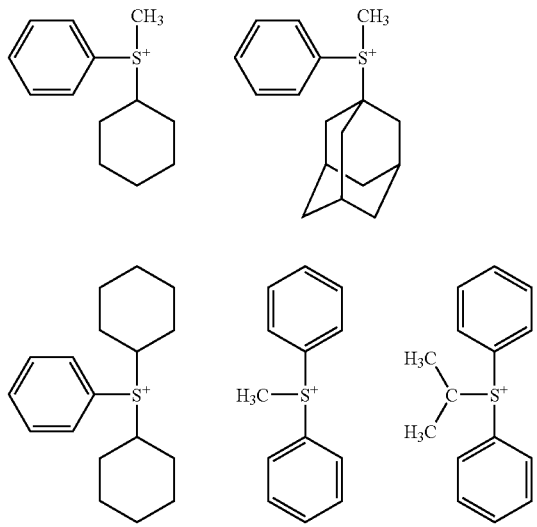

-continued
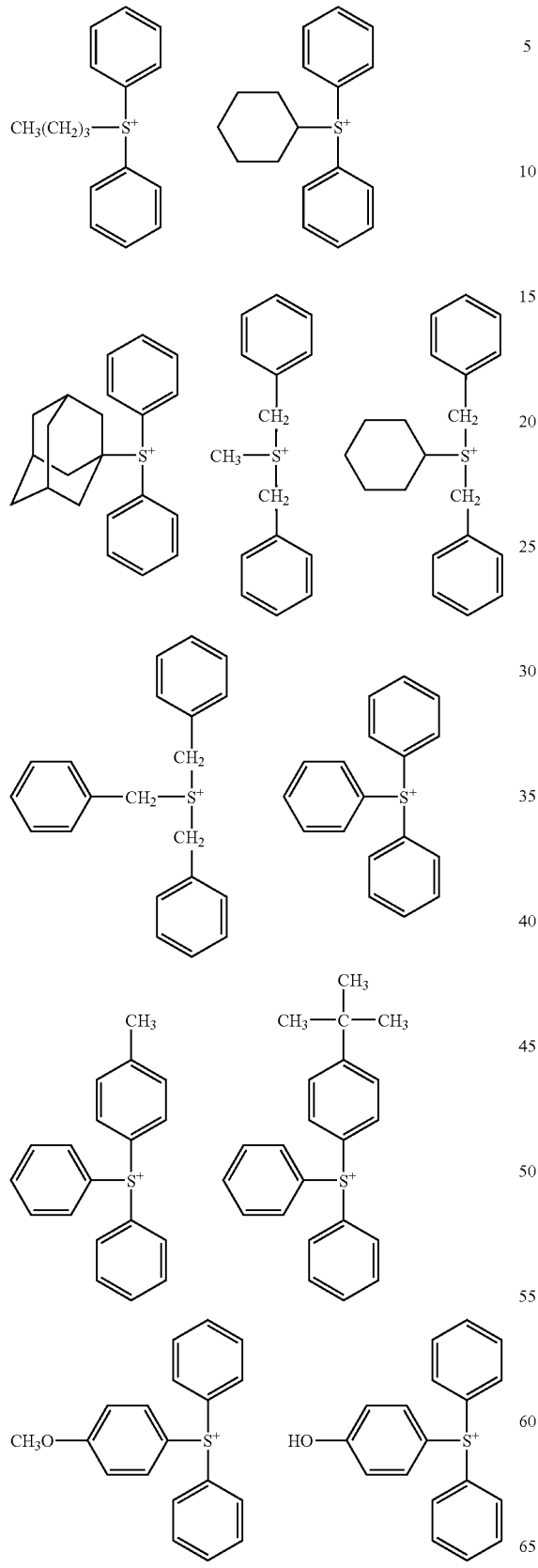
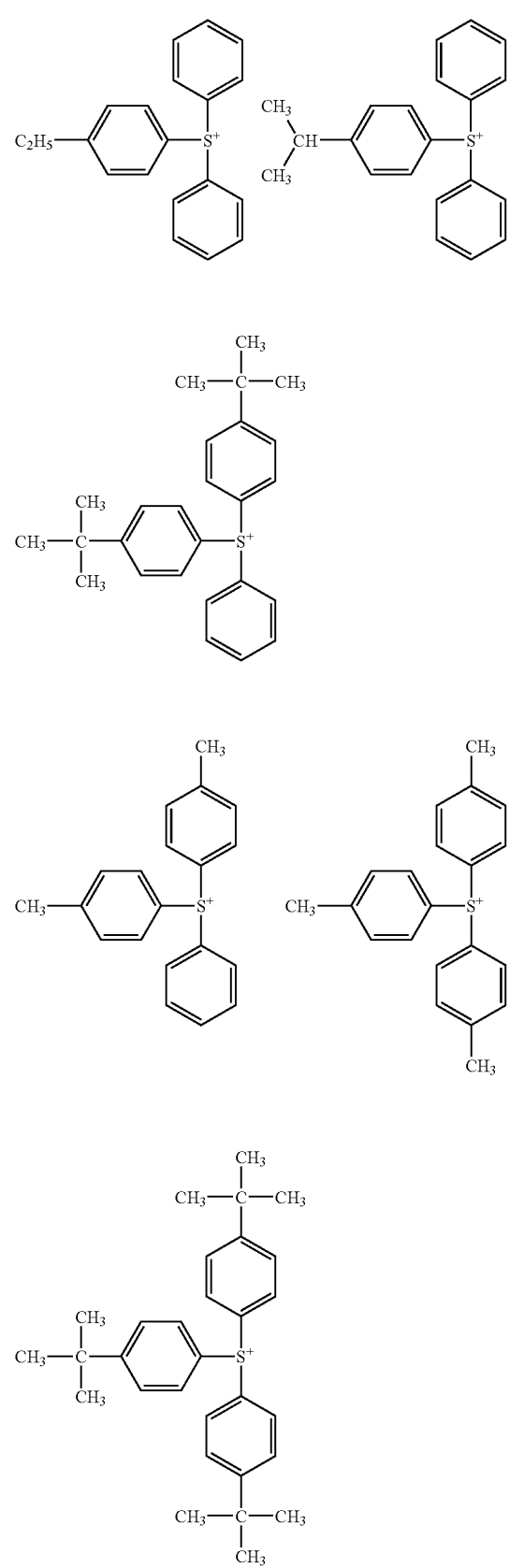

-continued
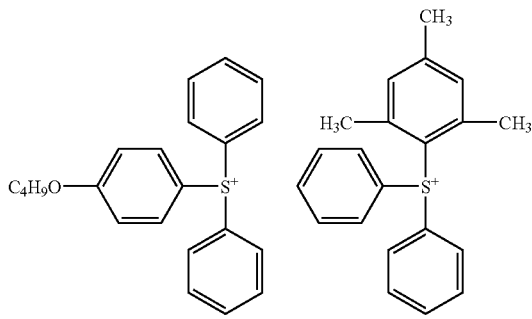
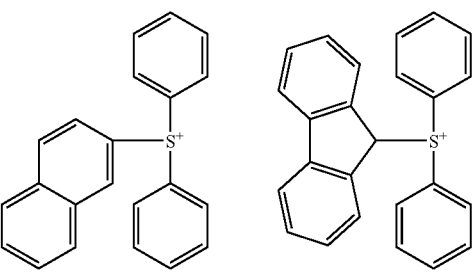
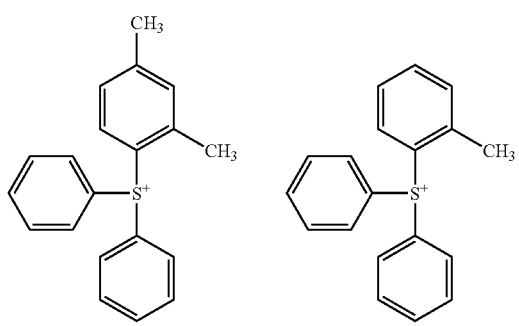
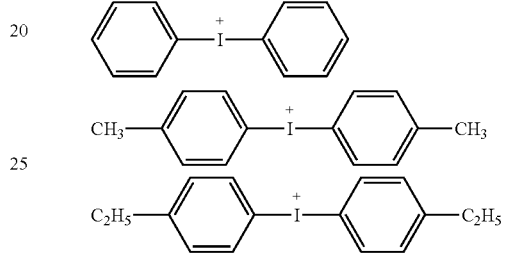
Examples of the cation represented by the formula (VIIIb) include the followings.
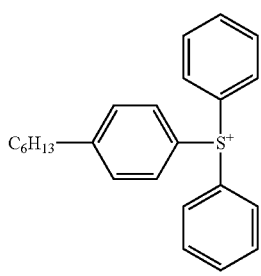
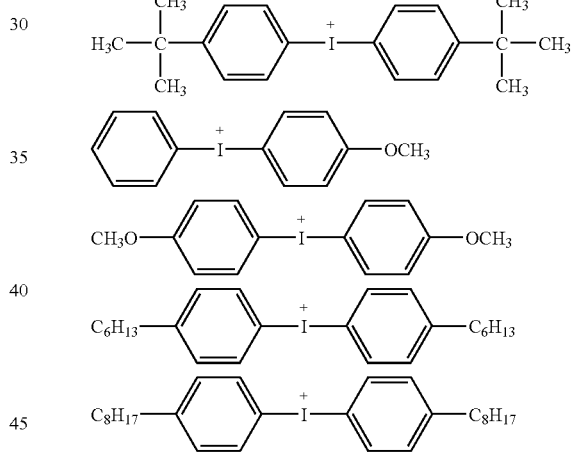
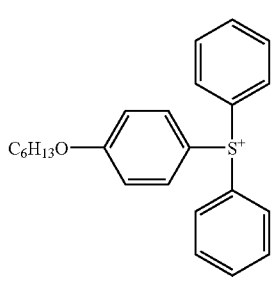
Examples of the cation represented by the formula (VIIIc) include the followings.
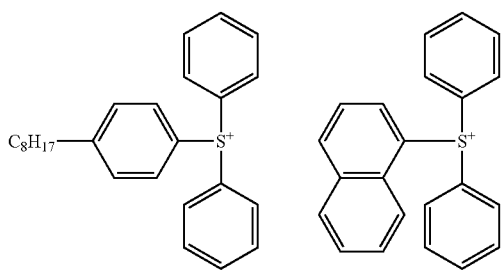
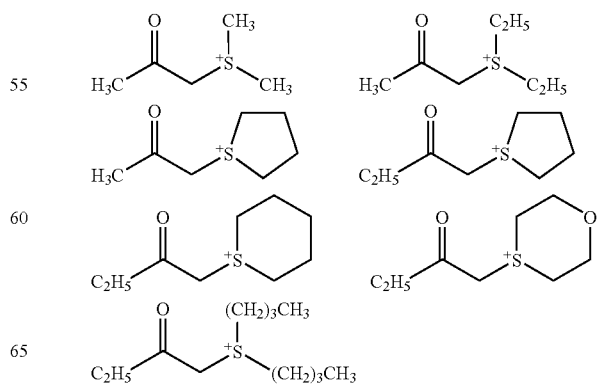

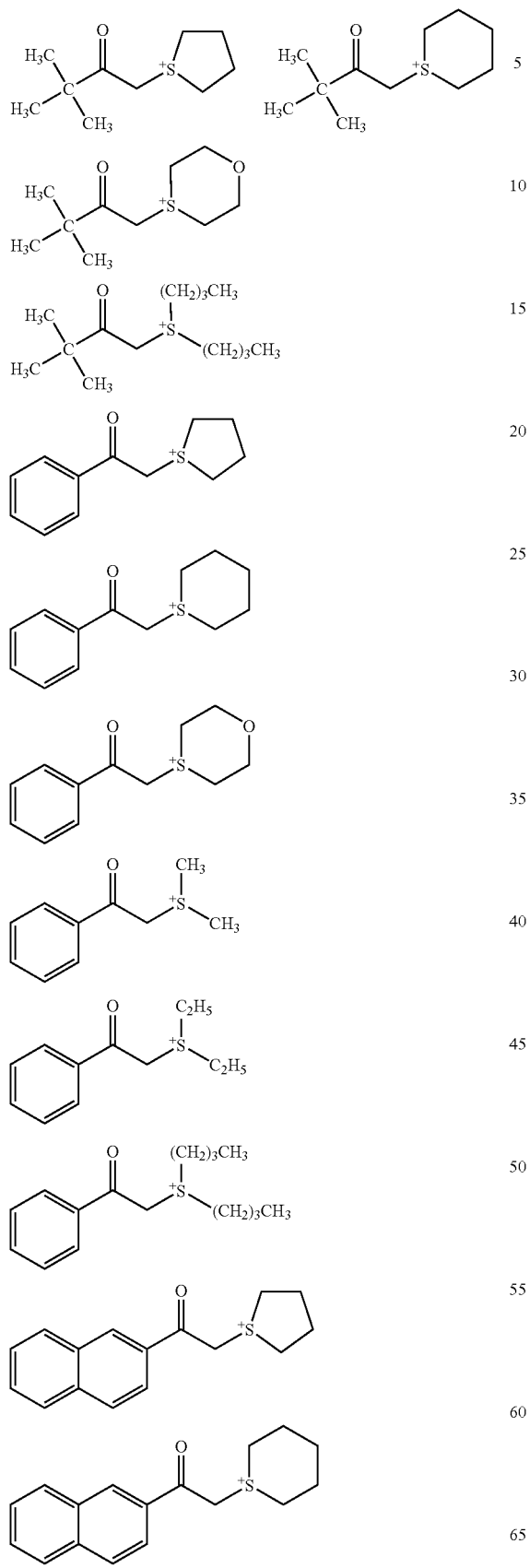
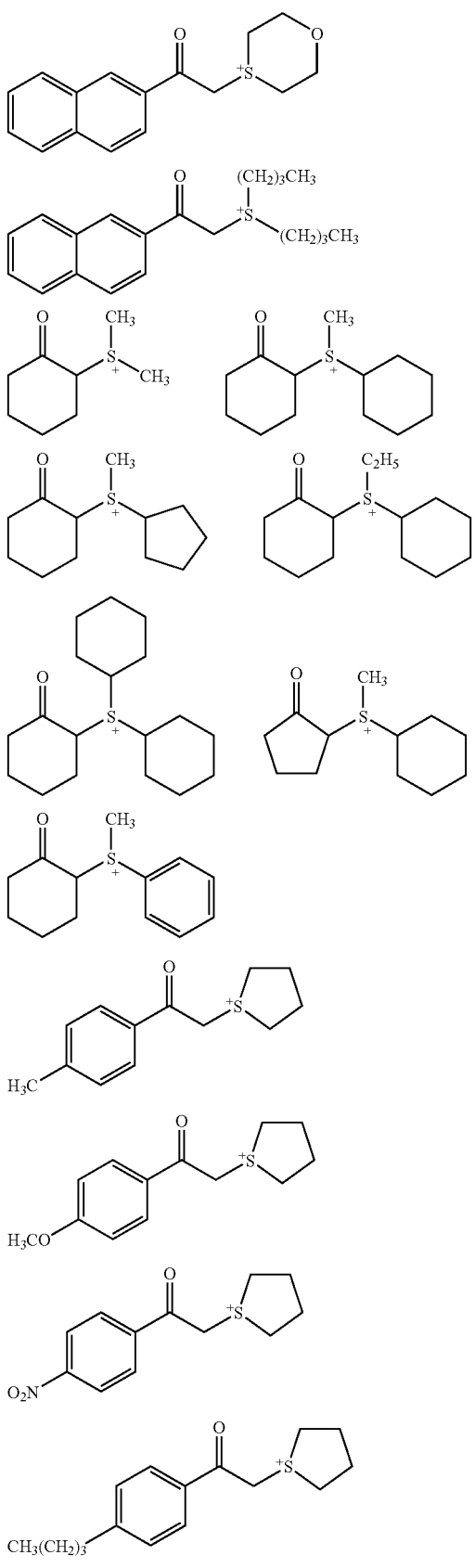

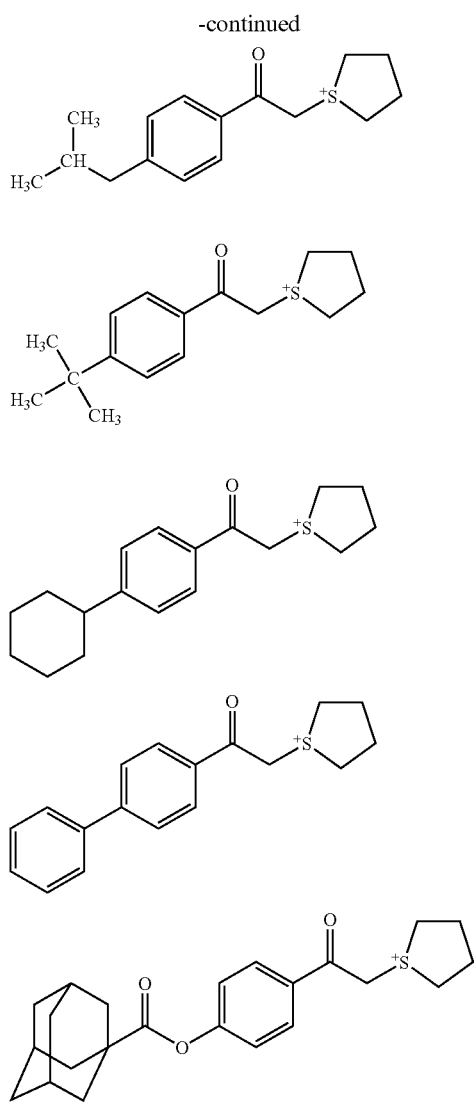
Examples of the cation represented by the formula (VIIId) include the followings.
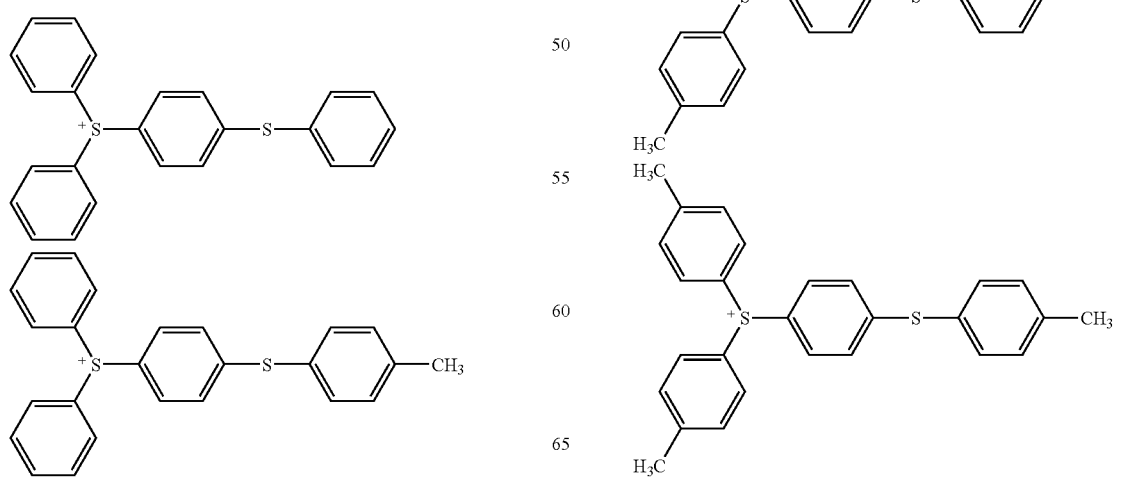

-continued
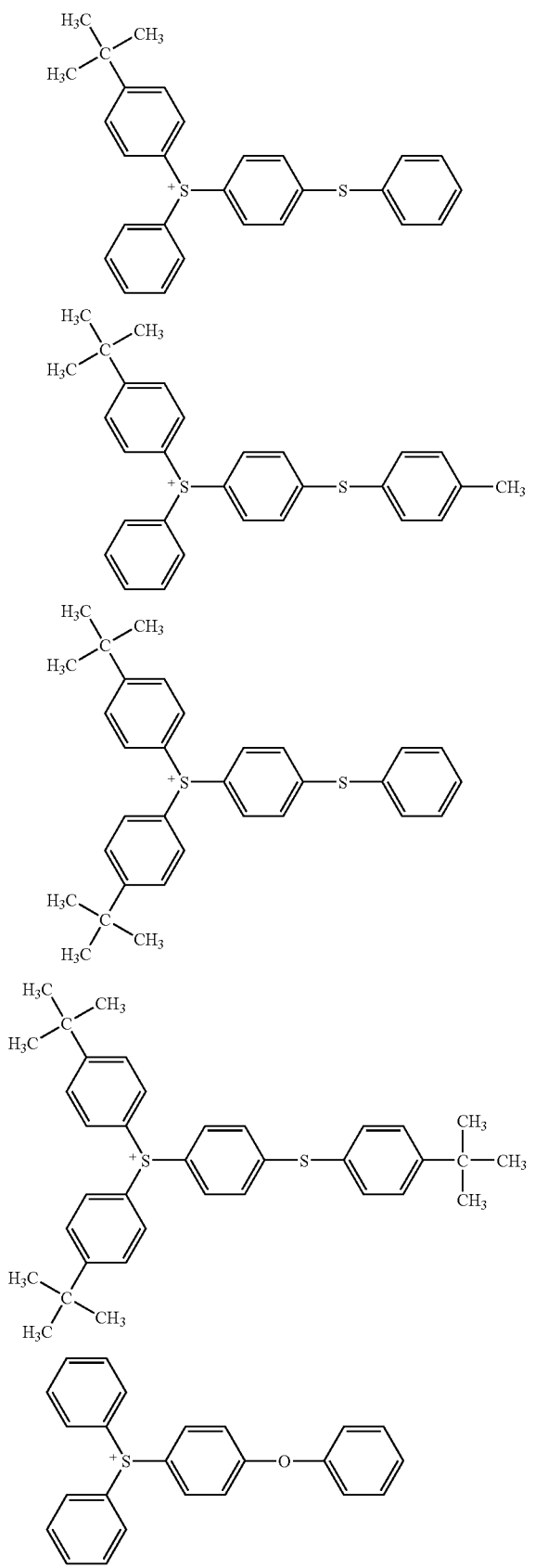
-continued
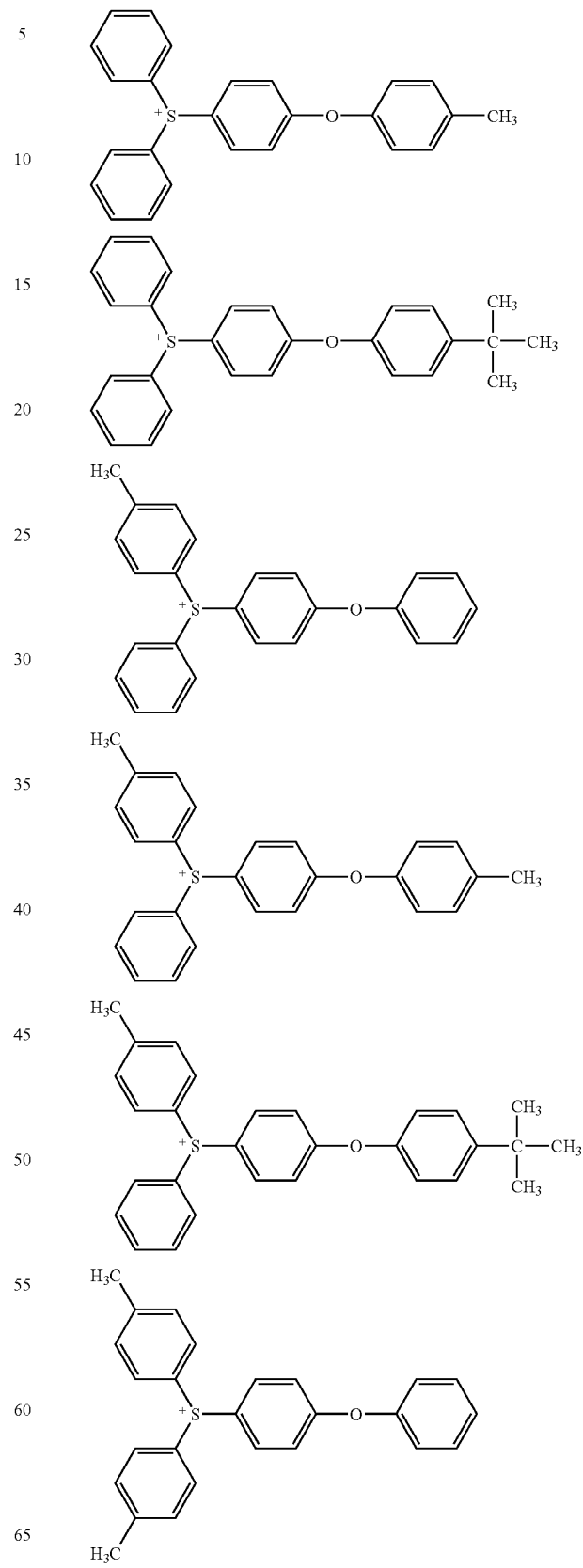

-continued
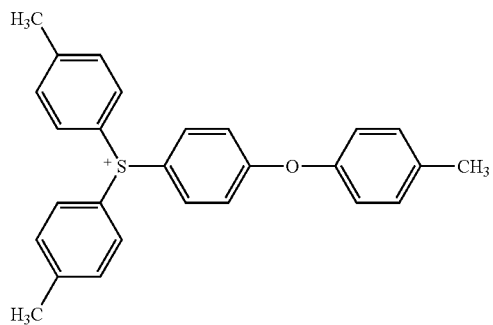
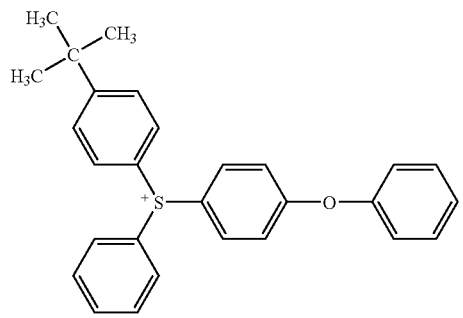
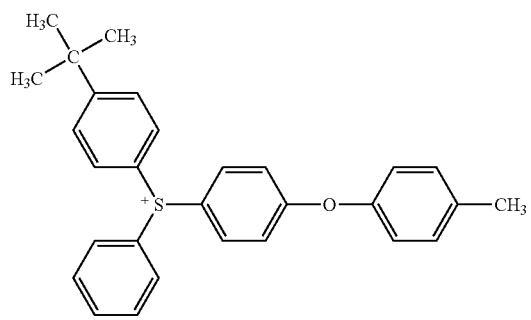
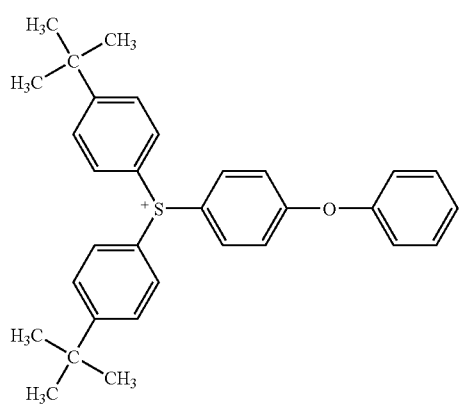
-continued
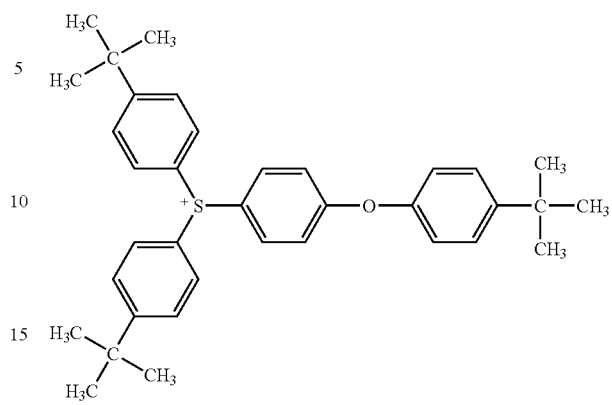
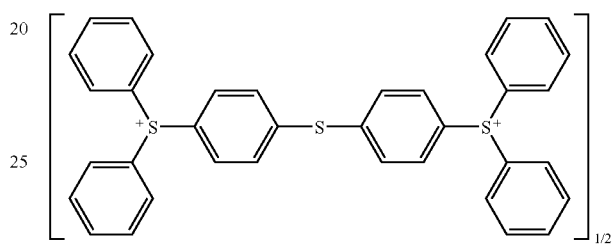
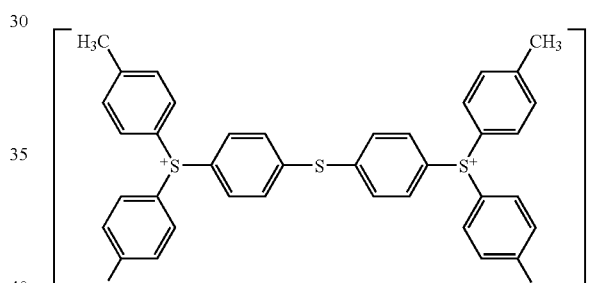
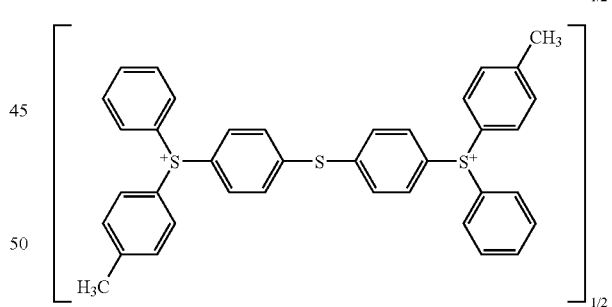
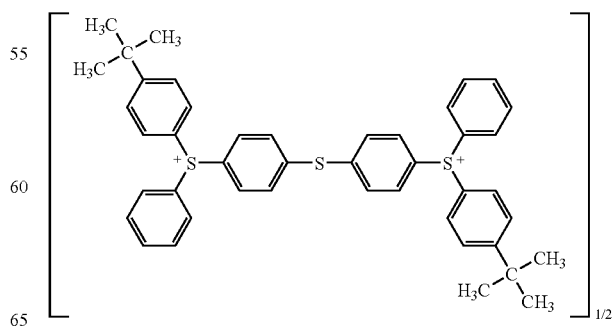

-continued

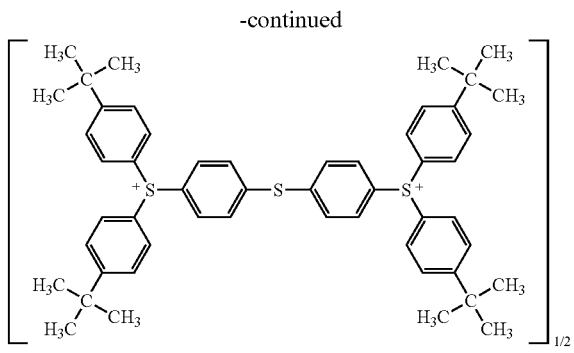

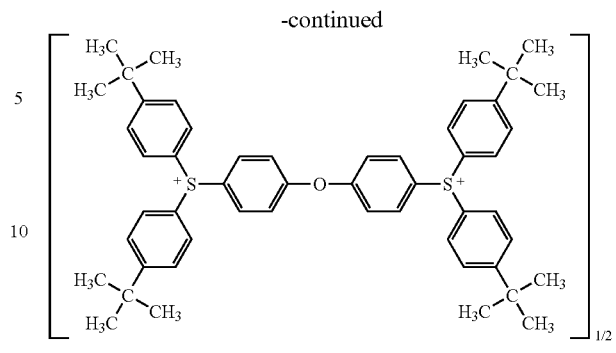

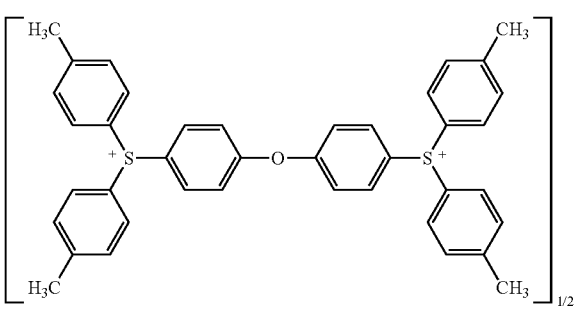

Examples of the halogenated alkyltriazine compound include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxoran-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-methoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine and 2-(4-pentyloxystyryl)-4,6-bis(trichloromethyl)-1,3,5-triazine.

Examples of the sulfonate compound include 1-benzoyl-1-phenylmethyl p-toluenesulfonate (generally called "benzoin tosylate"), 2-benzoyl-2-hydroxy-2-phenylethyl p-toluenesulfonate (generally called "α-methylolbenzoin tosylate"), 1,2,3-benzene-tri-yl tris(methanesulfonate), 2,6-dinitrobenzyl p-toluenesulfonate, 2-nitrobenzyl p-toluenesulfonate and 4-nitrobenzyl p-toluenesulfonate.

Examples of the imide compound having a sulfonyloxy group include N-(phenylsulfonyloxy)succinimide, N-(trifluoromethylsulfonyloxy)succinimide, N-(trifluoromethylsulfonyloxy)phthalimide, N-(trifluoromethylsulfonyloxy)-5-norbornene-2,3-dicarboxyimide, N-(trifluoromethylsulfonyloxy)naphthalimide and N-(10-camphorsulfonyloxy)naphthalimide.

Examples of the diazomethane compound having a sulfonyl group include a compound represented by the formula (IX):

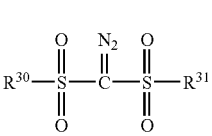

(IX)

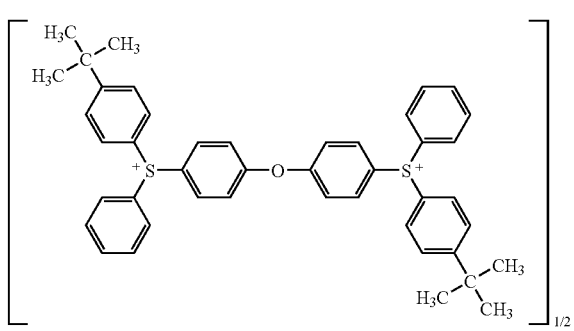

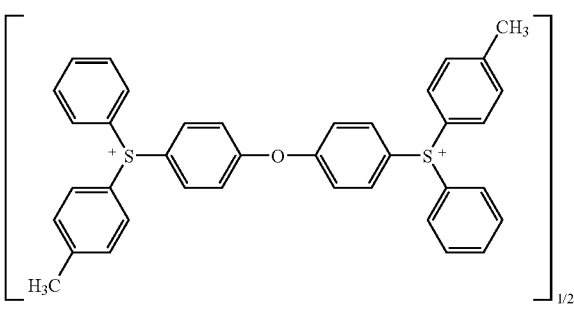

wherein $R^{30}$ and $R^{31}$ independently represents a C3-C8 linear, branched chain or cyclic alkyl group or an aryl group which may be substituted.

Examples of the C3-C8 linear, branched chain or cyclic alkyl group include a n-propyl, isopropyl, n-butyl, isobutyl, tert-butyl, n-pentyl, n-hexyl, n-octyl, cyclopentyl and cyclohexyl group.

Examples of the substitutent of the aryl group include a halogen atom such as a fluorine, chlorine and bromine atom.

Examples of the aryl group which may be substituted include a phenyl, 4-chlorophenyl, p-tolyl, 2,4-xylyl, 4-isopropylphenyl, 4 tert-butylphenyl, naphthyl and anthryl group.

Examples of the compound represented by the formula (IX) include bis(n-propylsulfonyl)diazomethane, bis(isopropylsulfonyl)diazomethane, bis(n-butylsulfonyl)diazomethane, bis(tert-butylsulfonyl)diazomethane, bis(cyclopentylsulfonyl)diazomethane, bis(cyclohexylsulfonyl)diazomethane, bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(4-isopropylphenylsulfonyl)diazomethane, bis(naphthylsulfonyl)diazomethane, and bis(anthrylsulfonyl)diazomethane.

Among them, bis(cyclohexylsulfonyl)diazomethane and bis(tert-butylsulfonyl)diazomethane are preferable.

It is preferable that COMPOSITION 1 contains the resin (A) in an amount of about 80 to 99.9% by weight and the acid generator (B) in an amount of 0.1 to 20% by weight on the total amount of the resin (A) and the acid generator (B).

Another chemically amplified positive resist composition of the present invention (hereinafter, simply referred to as COMPOSITION 2) comprises (A1) a resin which comprises a polymerization unit represented by the formula (I) and a polymerization unit represented by the formula (II), (A2) a resin which comprises a polymerization unit represented by the formula (I) and at least one polymerization unit selected from the group consisting of a polymerization unit represented by the formula (III) and a polymerization unit represented by the formula (IV), and (B') at least one acid generator.

Hereinafter, the component (A1) is simply referred to as the resin (A1), the component (A2) is simply referred to as the resin (A2) and the component (B') is simply referred to as the acid generator (B').

The resins (A1) and (A2) can be produced by polymerization of the corresponding monomers according to the same method as the method for producing the resin (A) described above.

It is preferable that COMPOSITION 2 contains the resins (A1) and (A2) in an amount of about 80 to 99.9% by weight and the acid generator (B') in an amount of 0.1 to 20% by weight on the total amount of the resin (A1), the resin (A2) and the acid generator (B').

The ration of the resin (A1) and the resin (A2) is usually 90/10 to 40/60, and preferably 80/20 to 50/50.

COMPOSITION 2 may contain an acid generator or two or more acid generators. COMPOSITION 2 preferable contains two or more acid generators.

The acid generator generates an acid by irradiation to itself or the composition containing the same, and the acid generated catalytically acts against the resins (A1) and (A2), and the resins (A1) and (A2) become soluble in an aqueous alkali solution.

The acid generator can be selected from various compounds generating the acid by irradiation with radiation on the acid generator itself or COMPOSITION 2.

As the acid generator, at least one selected from an onium salt, a halogenated alkyltriazine compound, a diazomethane compound having a sulfonyl group, a sulfonate compound and an imide compound having a sulfonyloxy group, is preferable. The onium salt, the diazomethane compound having a sulfonyl group and a mixture thereof are more preferable and a mixture of the onium salt and the diazomethane compound having a sulfonyl group is more preferable.

It is preferable that COMPOSITION 2 contains the resins (A1) and (A2) in an amount of about 80 to 99.9% by weight and the acid generator (B') in an amount of 0.1 to 20% by weight on the total amount of the resins (A1) and (A2) and the acid generator (B').

In COMPOSITION 1 and COMPOSITION 2, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

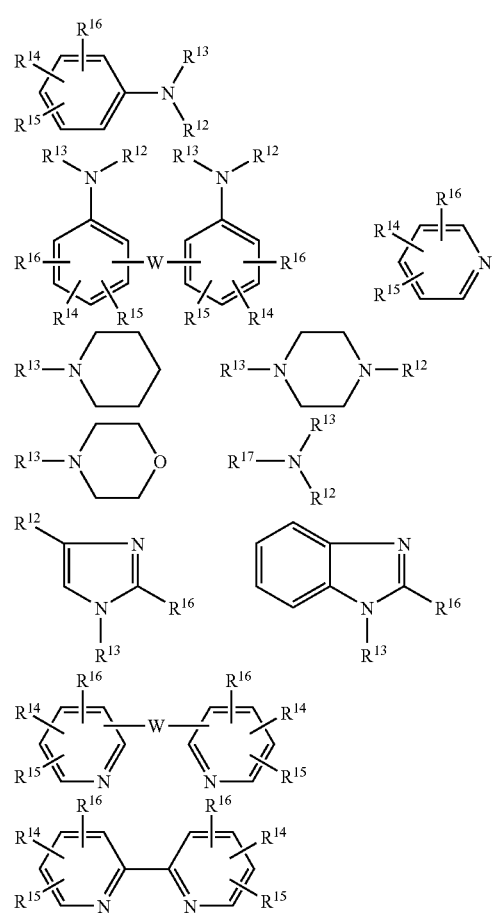

wherein $R^{12}$ and $R^{13}$ independently represent a hydrogen atom, an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group which may be substituted with a C1-C6 alkoxy group, $R^{14}$ and $R^{15}$ independently represent a hydrogen atom, an alkyl group, a cycloalkyl group, an aryl group or an alkoxy group, and the alkyl, cycloalkyl, aryl and alkoxy group may be substituted with at least one group selected from a hydroxyl group, an amino group which may be substituted with a C1-C4 alkyl group and a C1-C6 alkoxy group, or $R^{14}$ and $R^{15}$ bond together with the carbon atoms to which they bond to form an aromatic ring, $R^{16}$ represent a hydrogen atom, an alkyl group, a cycloalkyl group, an aryl group, an alkoxy group or a nitro group, and the alkyl, cycloalkyl, aryl and alkoxy group which may be substituted with at least one group selected from a hydroxyl group, an amino group which may be substituted with a C1-C4 alkyl group and a C1-C6 alkoxy group, $R^{17}$ represents an alkyl or cycloalkyl group, and the alkyl and cycloalkyl group may be substituted with at least one group selected from a hydroxyl group, an amino group which may be substituted with a C1-C4 alkyl group and a C1-C6 alkoxy group, and W represents —CO—, —NH—, —S—, —S—S—, an alkylene group of which at least one methylene group may be replaced with —O—, or an alkenylene group of which at least one methylene group may be replaced with —O—, and a quaternary ammonium hydroxide represented by the following formula:

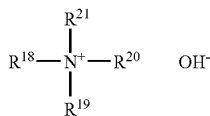

wherein $R^{18}$, $R^{19}$, $R^{20}$ and $R^{21}$ independently represent an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group The alkyl group in $R^{12}$, $R^{13}$, $R^{14}$, $R^{15}$, $R^{16}$, $R^{17}$, $R^{18}$, $R^{19}$, $R^{20}$ and $R^{21}$ preferably has about 1 to 10 carbon atoms, and more preferably has about 1 to 6 carbon atoms.

Examples of the amino group which may be substituted with the C1-C4 alkyl group include an amino, methylamino, ethylamino, n-butylamino, dimethylamino and diethylamino group. Examples of the C1-C6 alkoxy group which may be substituted with the C1-C6 alkoxy group include a methoxy, ethoxy, n-propoxy, isopropoxy, n-butoxy, tert-butoxy, n-pentyloxy, n-hexyloxy and 2-methoxyethoxy group.

Specific examples of the alkyl group which may be substituted with at least one group selected from a hydroxyl group, an amino group which may be substituted with a C1-C4 alkyl group, and a C1-C6 alkoxy group which may be substituted with a C1-C6 alkoxy group include a methyl, ethyl, n-propyl, isopropyl, n-butyl, tert-butyl, n-pentyl, n-hexyl, n-octyl, n-nonyl, n-decyl, 2-(2-methoxyethoxy)ethyl, 2-hydroxyethyl, 2-hydroxypropyl, 2-aminoethyl, 4-aminobutyl and 6-aminohexyl group.

The cycloalkyl group in $R^{12}$, $R^{13}$, $R^{14}$, $R^{15}$, $R^{16}$, $R^{17}$, $R^{18}$, $R^{19}$, $R^{20}$ and $R^{21}$ preferably has about 5 to 10 carbon atoms. Specific examples of the cycloalkyl group which may be substituted with at least one group selected from a hydroxyl group, an amino group which may be substituted with a C1-C4 alkyl group and a C1-C6 alkoxy group include a cyclopentyl, cyclohexyl, cycloheptyl and cyclooctyl group.

The aryl group in $R^{12}$, $R^{13}$, $R^{14}$, $R^{15}$, $R^{17}$, $R^{18}$, $R^{19}$, $R^{20}$ and $R^{21}$ preferably has about 6 to 10 carbon atoms. Specific examples of the aryl group which may be substituted with at least one group selected from a hydroxyl group, an amino group which may be substituted with a C1-C4 alkyl group and a C1-C6 alkoxy group include a phenyl and naphthyl group.

The alkoxy group in $R^{14}$, $R^{15}$ and $R^{16}$ preferably has about 1 to 6 carbon atoms and specific examples thereof include a methoxy, ethoxy, n-propoxy, isopropoxy, n-butoxy, tert-butoxy, n-pentyloxy and n-hexyloxy group.

The alkylene and alkenylene groups in W preferably have 2 to 6 carbon atoms. Specific examples of the alkylene group include an ethylene, trimethylene, tetramethylene, methylenedioxy and ethylene-1,2-dioxy group, and specific examples of the alkenylene group include an ethane-1,2-diyl, 1-propene-1,3-diyl and 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptyamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl]amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skeleton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.001 to 2% by weight of the basic compound based on the total amount of the resin component, the acid generator and the basic compound.

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by Examples, which are not construed to limit the scope of the present invention. The "%" and "part(s)" used to represent the content of any component and the amount of any material to be used in the following Examples are on a weight basis unless otherwise specifically noted. The weight-average molecular weight of any material in the following Examples is a value found by gel permeation chromatography using polystyrene as a standard reference material.

Resin Synthesis Example 1

Into the four-necked flask equipped with a stirrer, a reflux condenser and a thermometer, 179.2 parts of 4-acetoxystyrene, 48.4 parts of 2-ethyl-2-adamantyl methacrylate and 306 parts of methylisobutyl ketone were charged. The resultant mixture was heated to 80° C. and then, a solution prepared by mixing 36.0 parts of methyl isobutyl ketone and 13.5 parts of dimethyl-2,2'-azobis(2-methylpropionate) was added thereto dropwise over 10 minutes. The resultant mixture was kept at 80° C. for 15 hours and poured into a mixed solution of 4660 parts of methanol and 583 parts of water. The resin precipitated was collected by filtration. The resin was mixed with 751 parts of water and 25.4 parts of 4-dimethylaminopyridine was added thereto and the resultant mixture was kept at 62° C. for 15 hours. 37.5 Parts of glacial acetic acid was added thereto and the mixture obtained was stirred for 30 minutes. The mixture was poured into 6830 parts of water with stirring and the resin precipitated was collected by filtration. The resin was washed with water and dried under reduced pressure to obtain 174.5 parts of a resin comprising polymerization units derived from p-hydroxystyrene and derived from 2-ethyl-2-adamantyl methacrylate.

Into the four-necked flask equipped with a stirrer, a reflux condenser and a thermometer, 174.5 parts of the resin was charged and 1047 parts of acetone was added thereto. 29.5 Parts of triethylamine was added to the resultant solution and the mixture obtained was heated to 40° C. 27.3 Parts of benzoyl chloride was added dropwise to the mixture over 30 minutes and the resultant mixture was kept at 40° C. for 3 hours. 698 Parts of ethyl acetate and 640 parts of 0.5% aqueous oxalic acid solution were added to the mixture and separated to an organic layer and an aqueous layer. The organic layer was washed with aqueous oxalic acid solution and then, 698 parts of ethyl acetate, 698 parts of propylene glycol methyl ether acetate and 436 parts of water were added to the organic layer followed by separating to obtain an organic layer. The organic layer was washed four times with water and concentrated under reduced pressure to obtain the residue. The residue was mixed with propylene glycol methyl ether acetate and the resultant mixture was concentrated under reduced pressure to obtain 568 parts of a solution containing a resin (content of the resin: 35.4%).

The resin obtained is called as A1.

The weight-average molecular weight of the resin A1 was about 9,100 and the degree of dispersion (the weight-average molecular weight of the resin obtained/the molar-average molecular weight of the resin obtained) of the resin A1 was 1.72. The polymerization units of the resin A1 were following polymerization units (A), (B) and (C).

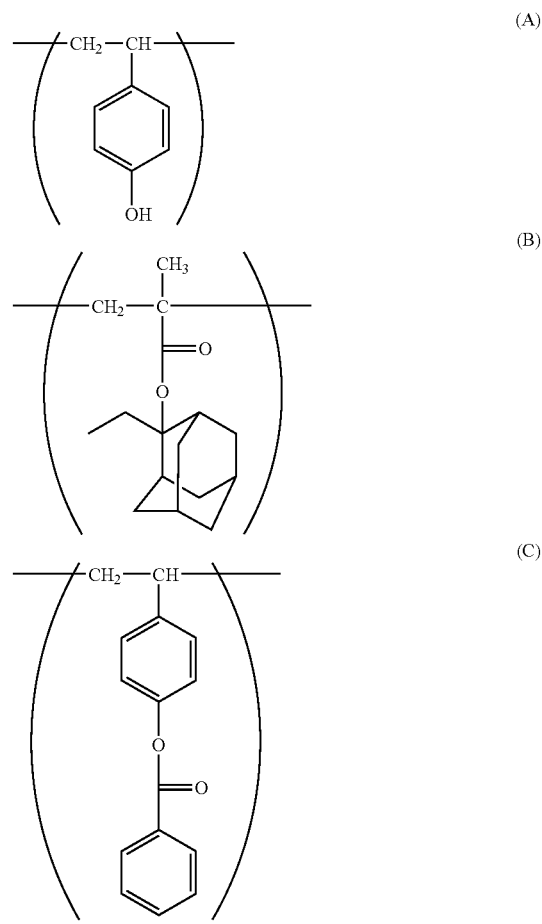

The ratio of the polymerization units (A), (B) and (C) in the resin A1 was 69/14/17 by $^{13}$C-NMR analysis.

Resin Synthesis Example 2

According to a similar manner as that of Resin Synthesis Example 1, a resin comprising the polymerization units (A), (B) and (C) was obtained except that the amount of benzoyl chloride was changed.

The resin obtained is called as A2.

The weight-average molecular weight of the resin A2 was about 9,800 and the degree of dispersion of the resin A2 was 1.73.

The ratio of the polymerization units (A), (B) and (C) in the resin A2 was 74/14/12 by $^{13}$C-NMR analysis.

Resin Synthesis Example 3

According to a similar manner as that of Resin Synthesis Example 1, a resin comprising the polymerization units (A), (B) and (C) was obtained except that the amount of benzoyl chloride was changed.

The resin obtained is called as A3.

The weight-average molecular weight of the resin A3 was about 9,300 and the degree of dispersion of the resin A3 was 1.66.

The ratio of the polymerization units (A), (B) and (C) in the resin A3 was 78/14/8 by $^{13}$C-NMR analysis.

Resin Synthesis Example 4

According to a similar manner as that of Resin Synthesis Example 1, a resin comprising the following polymerization units (A), (D) and (C) was obtained except that 2-ethyl-2-adamantyl acrylate was used in place of 2-ethyl-2-adamantyl methacrylate.

The resin obtained is called as A4.

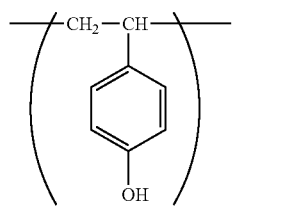
(A)

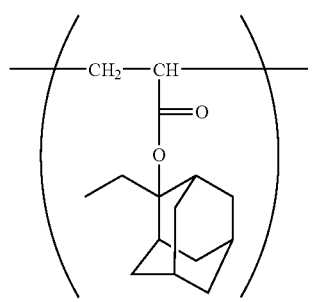
(D)

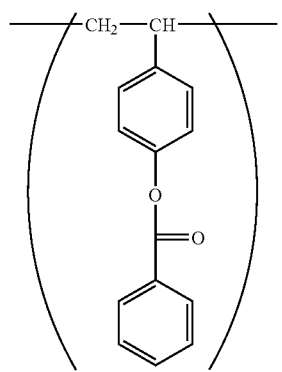
(C)

The weight-average molecular weight of the resin A4 was about 9,500 and the degree of dispersion of the resin A4 was 1.66.

The ratio of the polymerization units (A), (D) and (C) in the resin A4 was 74/14/12 by $^{13}$C-NMR analysis.

Resin Synthesis Example 5

Into the four-necked flask equipped with a stirrer, a reflux condenser and a thermometer, 136.3 parts of 4-acetoxystyrene, 44.7 parts of 2-ethyl-2-adamantyl methacrylate and 49.7 parts of 9-anthrylmethyl methacrylate (manufactured by Chiba Specialty Chemicals), and 312.9 parts of methyl isobutyl ketone were charged. The resultant mixture was heated to 80° C. and then, a solution prepared by mixing 33.2 parts of methyl isobutyl ketone and 12.4 parts of dimethyl-2,2'-azobis (2-methylpropionate) was added to the mixture dropwise over 10 minutes. The resultant mixture was kept at 80° C. for 15 hours and poured into a mixed solution of 4710 parts of methanol and 590 parts of water. The resin precipitated was collected by filtration. The resin was mixed with 760 parts of water and 23.5 parts of 4-dimethylaminopyridine was added thereto and the resultant mixture was kept at 62° C. for 15 hours. 34.6 Parts of glacial acetic acid was added thereto and the mixture obtained was stirred for 30 minutes. The mixture was poured into 6230 parts of water with stirring and the resin precipitated was collected by filtration. The resin was washed with water and dried under reduced pressure to obtain a resin comprising polymerization units derived from p-hydroxystyrene, derived from 2-ethyl-2-adamantyl methacrylate and derived from 9-anthrylmethyl methacrylate.

The resin obtained is called as A5.

The weight-average molecular weight of the resin A5 was about 5,700 and the degree of dispersion of the resin A5 was 1.87. The polymerization units of the resin A5 were following polymerization units (A), (B) and (E).

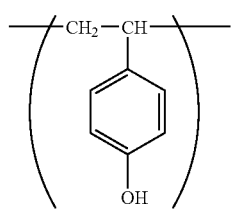
(A)

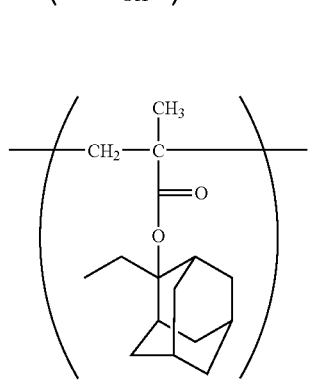
(B)

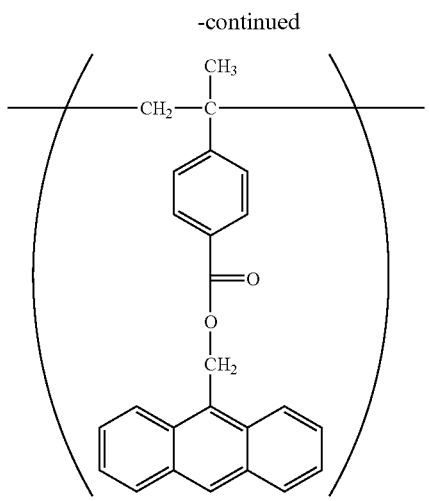

(E)

The ratio of the polymerization units (A), (B) and (E) in the resin A5 was 74/14/12 by $^{13}$C-NMR analysis.

Resin Synthesis Example 6

According to a similar manner as that of Resin Synthesis Example 5, a resin comprising the polymerization units (A), (B) and (E) was obtained except that the amount of 9-anthrylmethyl methacrylate was changed.

The resin obtained is called as A6.

The weight-average molecular weight of the resin A6 was about 8,700 and the degree of dispersion of the resin A6 was 1.85.

The ratio of the polymerization units (A), (B) and (E) in the resin A6 was 80/16/4 by $^{13}$C-NMR analysis.

Resin Synthesis Example 7

Into the four-necked flask equipped with a stirrer, a reflux condenser and a thermometer, 147.6 parts of 4-acetoxystyrene, 96.9 parts of 2-ethyl-2-adamantyl methacrylate and 331 parts of methylisobutyl ketone were charged. The resultant mixture was heated to 80° C. and then, a solution prepared by mixing 36.0 parts of methyl isobutyl ketone and 13.5 parts of dimethyl-2,2'-azobis(2-methylpropionate) was added to the mixture dropwise over 10 minutes. The resultant mixture was kept at 80° C. for 15 hours and poured into a mixed solution of 5000 parts of methanol and 625 parts of water. The resin precipitated was collected by filtration. The resin was mixed with 489 parts of water and 25.4 parts of 4-dimethylaminopyridine was added thereto and the resultant mixture was kept at 62° C. for 15 hours. 37.5 Parts of glacial acetic acid was added thereto and the mixture obtained was stirred for 30 minutes. The mixture was poured into 7334 parts of water with stirring and the resin precipitated was collected by filtration. The resin was washed with water and dried under reduced pressure to obtain a resin comprising polymerization units derived from p-hydroxystyrene and derived from 2-ethyl-2-adamantyl methacrylate.

The resin obtained is called as A7.

The weight-average molecular weight of the resin A7 was about 8,200 and the degree of dispersion of the resin A7 was 1.68. The polymerization units of the resin A7 were following polymerization units (A) and (B).

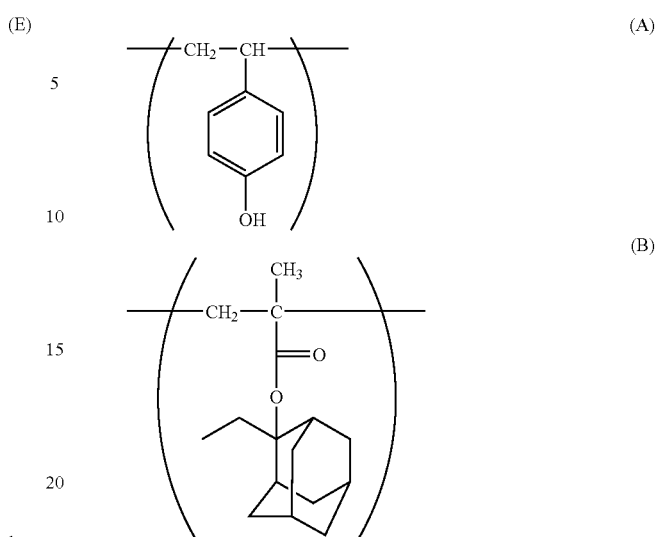

The ratio of the polymerization units (A) and (B) in the resin A7 was 70/30 by $^{13}$C-NMR analysis.

Resin Synthesis Example 8

According to a similar manner as that of Resin Synthesis Example 7, a resin comprising the polymerization units (A) and (B) was obtained except that the amounts of 4-acetoxystyrene and 2-ethyl-2-adamantyl methacrylate was changed.

The resin obtained is called as A8.

The weight-average molecular weight of the resin A8 was about 8,600 and the degree of dispersion of the resin A8 was 1.65.

The ratio of the polymerization units (A) and (B) in the resin A6 was 80/20 by $^{13}$C-NMR analysis.

Resin Synthesis Example 9

Into the four-necked flask equipped with a stirrer, a reflux condenser and a thermometer, 20 parts of a poly(p-hydroxystyrene) was charged and 120 parts of acetone was added thereto. 6.32 Parts of triethylamine was added to the resultant solution and the mixture obtained was heated to 40° C. 5.85 Parts of benzoyl chloride was added dropwise to the mixture over 30 minutes and the resultant mixture was kept at 40 deg. C. for 3 hours. 80 Parts of ethyl acetate and 73.3 parts of 0.5% aqueous oxalic acid solution were added to the mixture and separated to an organic layer and an aqueous layer. The organic layer was washed with aqueous oxalic acid solution and then, 80 parts of ethyl acetate and 73.3 parts of aqueous oxalic acid solution were added to the mixture again and separated to an organic layer and an aqueous layer. The organic layer was washed with aqueous oxalic acid solution and then, the organic layer was washed five times with water and concentrated under reduced pressure to obtain the residue. The residue was mixed with propylene glycol methyl ether acetate and the resultant mixture was concentrated under reduced pressure to obtain 62.1 parts of a solution containing a resin (content of the resin: 36.1%).

The resin obtained is called as A9.

The polymerization units of the resin A9 were following polymerization units (A) and (C).

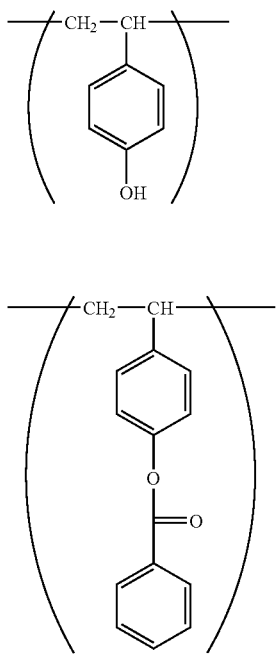

The ratio of the polymerization units (A) and (C) in the resin A9 was 76/24 by $^1$H-NMR analysis.

<Acid Generator>

Acid generator B1: triphenylsulfonium 2,4,6-triisopropybenzenesulfonate

Acid generator B2: bis cyclohexylsulfonyl)diazomethane

Acid generator B3: (4-methylphenyl)diphenylsulfonium perfluorobutanesulfonate

Acid generator B4: bis(4-tert-butylsulfonyl)diazomethane

Acid generator B5: tris(4-tert-butylphenyl)sulfonium perfluorobutanesulfonate

<Quencher>

Quencher C1: diisopropylaniline

<Solvent>

Solvent S1: propylene glycol monomethyl ether acetate/propylene glycol monomethyl ether (weight ratio: 8/2)

Solvent S2: propylene glycol monomethyl ether acetate

Examples 1 to 10 and Comparative Example 1

The following components were mixed to give a solution, and the solution was further filtrated through a fluorine resin filter having a pore diameter of 0.2 μm, to prepare resist liquid.

Resin (kind and amount are described in Table 1)
Acid generator (kind and amount are described in Table 1)
Quencher (kind and amount are described in Table 1)
Solvent (kind and amount are described in Table 1)

TABLE 1

| Ex. No. | Resin (kind/amount (part)) | Acid generator (kind/amount (part)) | Quencher (kind/amount (part)) | Solvent (kind/amount (part)) |
|---|---|---|---|---|
| Ex. 1 | A1/100 | B1/3.33 B2/3.33 | C1/0.44 | S1/1333.33 |
| Ex. 2 | A2/100 | B1/3.33 B2/33.3 | C1/0.44 | S1/1333.33 |
| Ex. 3 | A2/100 | B1/3.33 B2/6.67 | C1/0.44 | S1/1333.33 |
| Ex. 4 | A3/100 | B1/3.33 B2/3.33 | C1/0.44 | S1/1333.33 |
| Ex. 5 | A1/100 | B2/3.33 B3/3.51 | C1/0.44 | S1/1333.33 |
| Ex. 6 | A4/100 | B1/3.33 B2/6.67 | C1/0.44 | S1/1333.33 |
| Ex. 7 | A5/100 | B1/3.33 B2/6.67 | C1/0.44 | S1/1333.33 |
| Ex. 8 | A5/50 A6/50 | B1/3.33 B2/6.67 | C1/0.44 | S1/1333.33 |
| Ex. 9 | A6/100 | B1/3.33 B2/6.67 | C1/0.44 | S1/1333.33 |
| Comp. Ex. 1 | A7/50 A8/50 | B1/3.33 B2/3.33 | C1/0.44 | S1/1333.33 |

Each of the resist liquids prepared as above was spin-coated over the silicon wafer. After coating each of the resist liquids, the silicon wafers thus coated with the respective resist liquids were each prebaked on a proximity hotplate at a temperature of 100° C. for 60 seconds to form resist film of which thickness was 0.24 μm. Using a KrF excimer laser stepper ("NSR-2205EX12B" manufactured by Nikon Corporation, NA=0.55, σ=0.80), each wafer on which the respective resist film had been thus formed was exposed via several masks having different shapes and size.

After the exposure, each wafer was subjected to post-exposure baking on a hotplate at a temperature of 110° C. for 60 seconds and then to paddle development for 60 seconds with an aqueous solution of 2.38% tetramethylammonium hydroxide.

Each of a pattern developed on the substrate after the development was observed with a scanning electron microscope, and the results of which are shown in Table 2.

Effective Sensitivity (ES): It is expressed as the amount of exposure that the line and space pattern become 1:1 after exposure through 0.25 μm line and space pattern mask and development.

Resolution: It is expressed as the minimum size of space pattern which gave the space pattern split by the line pattern at the exposure amount of the effective sensitivity.

Profile: Each of a wall surface of pattern developed on the organic anti-reflective coating substrate after the development was observed with a scanning electron microscope. When the wall surface was a waved pattern, an amplitude of the wave pattern was high, and T-top was found, its evaluation was marked by "X", when the wall surface was flat or nearly flat pattern, its evaluation was marked by "○", and when the wall surface was a waved pattern and an amplitude of the waved pattern was low, its evaluation was marked by "Δ".

TABLE 2

| Ex. No. | Profile | Resolution (μm) |
|---|---|---|
| Ex. 1 | Δ | 0.19 |
| Ex. 2 | Δ | 0.20 |
| Ex. 3 | ○ | 0.19 |
| Ex. 4 | Δ | 0.20 |

TABLE 2-continued

| Ex. No. | Profile | Resolution (μm) |
|---|---|---|
| Ex. 5 | Δ | 0.20 |
| Ex. 6 | ○ | 0.19 |
| Ex. 7 | ○ | 0.18 |
| Ex. 8 | ○ | 0.19 |
| Ex. 9 | ○ | 0.20 |
| Comp. Ex. 1 | X | 0.22 |

Each of the resist liquids prepared as above was spin-coated over the several silicon wafers. After coating each of the resist liquids, the silicon wafers thus coated with the respective resist liquids were each prebaked on a proximity hotplate at a temperature of 100° C. for 60 seconds to form the several resist films of which thickness were 0.20 to 0.30 μm. Using a KrF excimer laser stepper ("NSR-2205EX12B" manufactured by Nikon Corporation, NA=0.55, σ=0.80), each wafer on which the respective resist film had been thus formed was exposed.

After the exposure, each wafer was subjected to post-exposure baking on a hotplate at a temperature of 110° C. for 60 seconds and then to paddle development for 60 seconds with an aqueous solution of 2.38% tetramethylammonium hydroxide.

Each of a pattern developed on the substrate after the development was observed with a scanning electron microscope.

The line and space patterns after exposure through 0.25 μm line and space pattern mask and development at the constant exposure amount were observed. The line widths of the patterns (CD) were measured and the differences between the maximum line width of the pattern and the minimum line width of the pattern (CD-SW) were calculated. The smaller the value of CD-SW was, the better the pattern was.

The results are shown in Table 3.

TABLE 3

| Ex. No. | CD-SW (nm) |
|---|---|
| Ex. 1 | 100 |
| Ex. 2 | 98 |
| Ex. 3 | 112 |
| Ex. 4 | 148 |
| Ex. 5 | 148 |
| Ex. 6 | 129 |
| Ex. 7 | 7 |
| Ex. 8 | 26 |
| Ex. 9 | 93 |
| Comp. Ex. 1 | 163 |

Example 10

The following components were mixed to give a solution, and the solution was further filtrated through a fluorine resin filter having a pore diameter of 0.2 μm, to prepare resist liquid.

Resin (kind and amount are described in Table 4)
Acid generator (kind and amount are described in Table 4)
Quencher (kind and amount are described in Table 4)
Solvent (kind and amount are described in Table 4)

TABLE 4

| Ex. No. | Resin (kind/amount (part)) | Acid generator (kind/amount (part)) | Quencher (kind/amount (part)) | Solvent (kind/amount (part)) |
|---|---|---|---|---|
| Ex. 10 | A7/50 A9/50 | B4/3.33 B5/3.33 | C1/0.30 | S2/911 |

The resist liquid prepared as above was spin-coated over the several silicon wafers. After coating each of the resist liquids, the silicon wafers thus coated with the respective resist liquids were each prebaked on a proximity hotplate at a temperature of 100° C. for 60 seconds to form the several resist films of which thickness were 0.25 μm. Using a KrF excimer laser stepper ("NSR-2205EX12B" manufactured by Nikon Corporation, NA=0.55, σ=0.80), each wafer on which the respective resist film had been thus formed was exposed.

After the exposure, each wafer was subjected to post-exposure baking on a hotplate at a temperature of 110° C. for 60 seconds and then to paddle development for 60 seconds with an aqueous solution of 2.38% tetramethylammonium hydroxide.

Each of a pattern developed on the substrate after the development was observed with a scanning electron microscope, and the results of which are shown in Table 5.

Effective Sensitivity (ES): It is expressed as the amount of exposure that the line and space pattern become 1:1 after exposure through 0.24 μm line and space pattern mask and development.

Resolution: It is expressed as the minimum size of space pattern which gave the space pattern split by the line pattern at the exposure amount of the effective sensitivity.

Profile: Each of a wall surface of pattern developed on the organic anti-reflective coating substrate after the development was observed with a scanning electron microscope. When the wall surface was a waved pattern, an amplitude of the wave pattern was high, and T-top was found, its evaluation was marked by "X", when the wall surface was flat or nearly flat pattern, its evaluation was marked by "○", and when the wall surface was a waved pattern and an amplitude of the waved pattern was low, its evaluation was marked by "Δ".

CD-SW: The line and space patterns after exposure through 0.24 μm line and space pattern mask and development at the constant exposure amount were observed. The line widths of the patterns (CD) were measured and the differences between the maximum line width of the pattern and the minimum line width of the pattern (CD-SW) were calculated. The smaller the value of CD-SW was, the better the pattern was.

TABLE 5

| Ex. No. | Profile | Resolution (μm) | CD-SW (nm) |
|---|---|---|---|
| Ex. 10 | Δ | 0.18 | 110 |

The present chemically amplified positive resist compositions give patterns having high resolution and good profile.

What is claimed is:

1. A chemically amplified positive resist composition comprising (A) a resin which comprises (i) a polymerization unit represented by the formula (I):

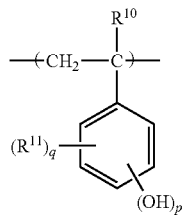

(I)

wherein $R^{10}$ represents a hydrogen atom or a C1-C4 alkyl group, $R^{11}$ represents a C1-C4 alkyl group, p represents an integer of 1 to 3, and q represents an integer of 0 to 2, and when q is 1 or 2, $R^{11}$'s may be the same or different, (ii) a polymerization unit represented by the formula (II):

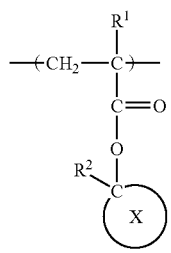

(II)

wherein $R^1$ represents a hydrogen atom or a methyl group, $R^2$ represents a C1-C8 alkyl group and ring X represents an alicyclic hydrocarbon group, and (iii) at least one polymerization unit selected from the group consisting of a polymerization unit represented by the formula (III):

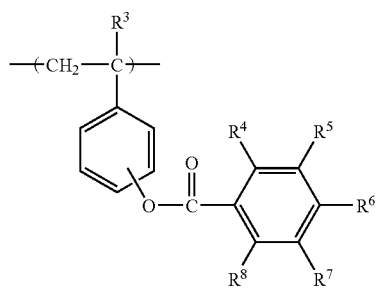

(III)

wherein $R^3$ represents a hydrogen atom or a C1-C4 alkyl group, and $R^4$, $R^5$, $R^6$, $R^7$ and $R^8$ each independently represents a hydrogen atom, a C1-C4 alkyl group, a C1-C4 alkoxy group or a hydroxyl group and a polymerization unit represented by the formula (IV):

(IV)

wherein $R^9$ represents a hydrogen atom or a methyl group, $n_1$ represents 0 or 1, and $R^a$ represents an anthryl group which may be substituted with at least one selected from the group consisting of a C1-C6 alkyl group and a hydroxyl group, and (B) at least one acid generator.

2. The chemically amplified positive resist composition according to claim 1, wherein at least one polymerization unit selected from the group consisting of a polymerization unit represented by the formula (III) and a polymerization unit represented by the formula (IV) is a polymerization unit represented by the formula (III).

3. The chemically amplified positive resist composition according to claim 1, wherein the polymerization unit represented by the formula (II) is a polymerization unit represented by the formula (IIa):

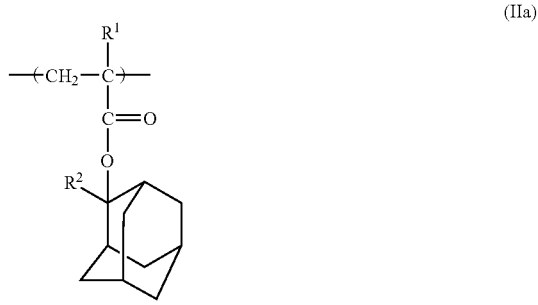

(IIa)

wherein $R^1$ represents a hydrogen atom or a methyl group and $R^2$ represents a C1-C8 alkyl group.

4. The chemically amplified positive resist composition according to claim 1, wherein p is 1 and q is 0 in the formula (I).

5. The chemically amplified positive resist composition according to claim 1, wherein at least one acid generator comprises diazomethane compound having a sulfonyl group.

6. The chemically amplified positive resist composition according to claim 1, wherein the polymerization unit represented by the formula (I), the polymerization unit represented by the formula (II) and at least one polymerization unit selected from the group consisting of the polymerization unit represented by the formula (III) and the polymerization unit represented by the formula (IV) are in the range of 30 to 89.9% by mole, in the range of 10 to 40% by mole and is in the range of 0.1 to 30% by mole respectively based on all polymerization units of the resin.

7. The chemically amplified positive resist composition according to claim 1, wherein the chemically amplified positive resist composition further comprises a basic compound.

8. A chemically amplified positive resist composition comprising (A1) a resin which comprises a polymerization unit represented by the formula (I):

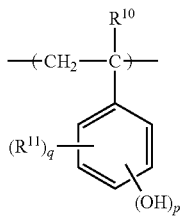

(I)

wherein $R^{10}$ represents a hydrogen atom or a C1-C4 alkyl group, $R^{11}$ represents a C1-C4 alkyl group, p represents an integer of 1 to 3, and q represents an integer of 0 to 2, and when q is 1 or 2, $R^{11}$'s may be the same or different, and a polymerization unit represented by the formula (II):

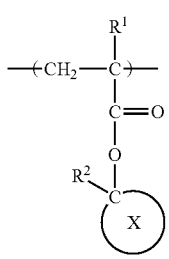

(II)

wherein $R^1$ represents a hydrogen atom or a methyl group, $R^2$ represents a C1-C8 alkyl group and ring X represents an alicyclic hydrocarbon group, (A2) a resin which comprises a polymerization unit represented by the formula (I) and at least one polymerization unit selected from the group consisting of a polymerization unit represented by the formula (III):

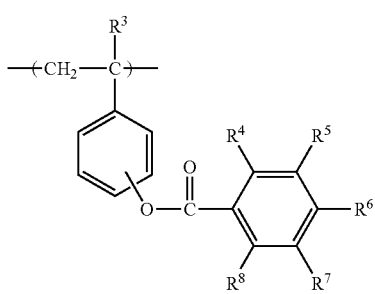

(III)

wherein $R^3$ represents a hydrogen atom or a C1-C4 alkyl group, and $R^4$, $R^5$, $R^6$, $R^7$ and $R^8$ each independently represents a hydrogen atom, a C1-C4 alkyl group, a C1-C4 alkoxy group or a hydroxyl group and a polymerization unit represented by the formula (IV):

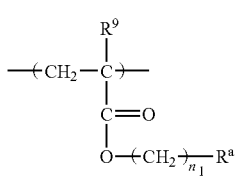

(IV)

wherein $R^9$ represents a hydrogen atom or a methyl group, $n_1$ represents 0 or 1, and $R^a$ represents an anthryl group which may be substituted with at least one selected from the group consisting of a C1-C6 alkyl group and a hydroxyl group, and (B') at least one acid generator.

9. The chemically amplified positive resist composition according to claim 8, wherein at least one polymerization unit selected from the group consisting of a polymerization unit represented by the formula (III) and a polymerization unit represented by the formula (IV) is a polymerization unit represented by the formula (III).

10. The chemically amplified positive resist composition according to claim 8, wherein the polymerization unit represented by the formula (II) is a polymerization unit represented by the formula (IIa):

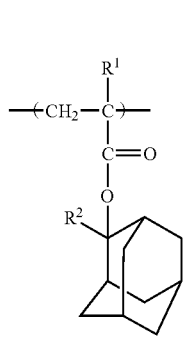

(IIa)

wherein $R^1$ represents a hydrogen atom or a methyl group and $R^2$ represents a C1-C8 alkyl group.

11. The chemically amplified positive resist composition according to claim 8, wherein p is 1 and q is 0 in the formula (I).

12. The chemically amplified positive resist composition according to claim 8, wherein at least one acid generator comprises diazomethane compound having a sulfonyl group.

13. The chemically amplified positive resist composition according to claim 8, wherein the amount ratio of the resin (A1) and the resin (A2) is 40/60 to 90/10.

14. The chemically amplified positive resist composition according to claim 8, wherein the polymerization unit represented by the formula (I) and the polymerization unit represented by the formula (II) are in the range of 40 to 85% by mole and in the range of 15 to 60% by mole respectively based on all polymerization units of the resin (A1).

15. The chemically amplified positive resist composition according to claim 8, wherein the polymerization unit represented by the formula (I) and at least one polymerization unit selected from the group consisting of a polymerization unit represented by the formula (III) and a polymerization unit represented by the formula (IV) are in the range of 50 to 90% by mole and in the range of 10 to 50% by mole respectively based on all polymerization units of the resin (A2).

16. The chemically amplified positive resist composition according to claim 8, wherein the chemically amplified positive resist composition further comprises a basic compound.

* * * * *